US011024350B2

(12) United States Patent
Kim

(10) Patent No.: US 11,024,350 B2
(45) Date of Patent: Jun. 1, 2021

(54) SEMICONDUCTOR DEVICE INCLUDING A CALIBRATION CIRCUIT CAPABLE OF GENERATING STROBE SIGNALS AND CLOCK SIGNALS HAVING ACCURATE DUTY RATIO AND TRAINING METHOD THEREOF

(71) Applicant: SK hynix Inc., Gyeonggi-do (KR)

(72) Inventor: Young-Hoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/670,719

(22) Filed: Oct. 31, 2019

(65) Prior Publication Data

US 2020/0302979 A1 Sep. 24, 2020

(30) Foreign Application Priority Data

Mar. 20, 2019 (KR) .................. 10-2019-0031885

(51) Int. Cl.
*G11C 7/22* (2006.01)
*H03M 9/00* (2006.01)
(Continued)

(52) U.S. Cl.
CPC .............. *G11C 7/222* (2013.01); *G06F 13/16* (2013.01); *G11C 7/1084* (2013.01); *G11C 7/22* (2013.01);
(Continued)

(58) Field of Classification Search
CPC ....... G11C 7/1084; G11C 7/222; G11C 7/225; G11C 2207/2254
See application file for complete search history.

(56) References Cited

U.S. PATENT DOCUMENTS 8,423,813 B2 4/2013 Huang
9,449,665 B1* 9/2016 Kim ..................... G11C 7/10
(Continued)

FOREIGN PATENT DOCUMENTS

KR 10-0813554 3/2008

*Primary Examiner* — Mushfique Siddique
(74) *Attorney, Agent, or Firm* — IP & T Group LLP

(57) ABSTRACT

A semiconductor device includes a transmission circuit suitable for sequentially outputting pulses corresponding to first to $N^{th}$ output clocks to a data strobe pad in a training mode; a receiving circuit suitable for generating a rising signal and a falling signal, which are activated respectively at a rising edge and a falling edge of each of the pulses; a calibration circuit suitable for sequentially storing a detection code corresponding to a phase difference between the rising signal and the falling signal in first to $N^{th}$ registers to calculate an average value of first to $N^{th}$ stored values, according to a period signal, and restoring respective deviations between the average value and each of the first to $N^{th}$ stored values in the first to $N^{th}$ registers; and a clock generation circuit suitable for adjusting duty ratios of the first to $N^{th}$ output clocks, using re-stored values of the first to $N^{th}$ registers.

21 Claims, 19 Drawing Sheets

(51) Int. Cl.
*G11C 7/10* (2006.01)
*G11C 11/4076* (2006.01)
*G06F 13/16* (2006.01)
*G11C 29/02* (2006.01)

(52) U.S. Cl.
CPC .......... *G11C 7/225* (2013.01); *G11C 11/4076* (2013.01); *H03M 9/00* (2013.01); *G11C 29/023* (2013.01); *G11C 2207/2254* (2013.01)

(56) References Cited

U.S. PATENT DOCUMENTS

| | | | |
|---|---|---|---|
| 9,792,969 B1* | 10/2017 | Kim | G11C 7/22 |
| 2003/0031082 A1* | 2/2003 | Sawada | G11C 7/222 |
| | | | 365/233.1 |
| 2007/0002644 A1* | 1/2007 | Kang | G11C 7/1093 |
| | | | 365/193 |
| 2008/0164922 A1* | 7/2008 | Yun | H03L 7/0816 |
| | | | 327/160 |
| 2010/0299644 A1* | 11/2010 | Kawai | G11C 7/1051 |
| | | | 716/113 |
| 2017/0270982 A1* | 9/2017 | Song | G11C 29/028 |
| 2019/0238156 A1 | 8/2019 | Kim | |
| 2019/0253041 A1 | 8/2019 | Kim | |
| 2019/0279692 A1* | 9/2019 | Song | G11C 29/023 |
| 2020/0019345 A1* | 1/2020 | Wang | G06F 3/0604 |

* cited by examiner

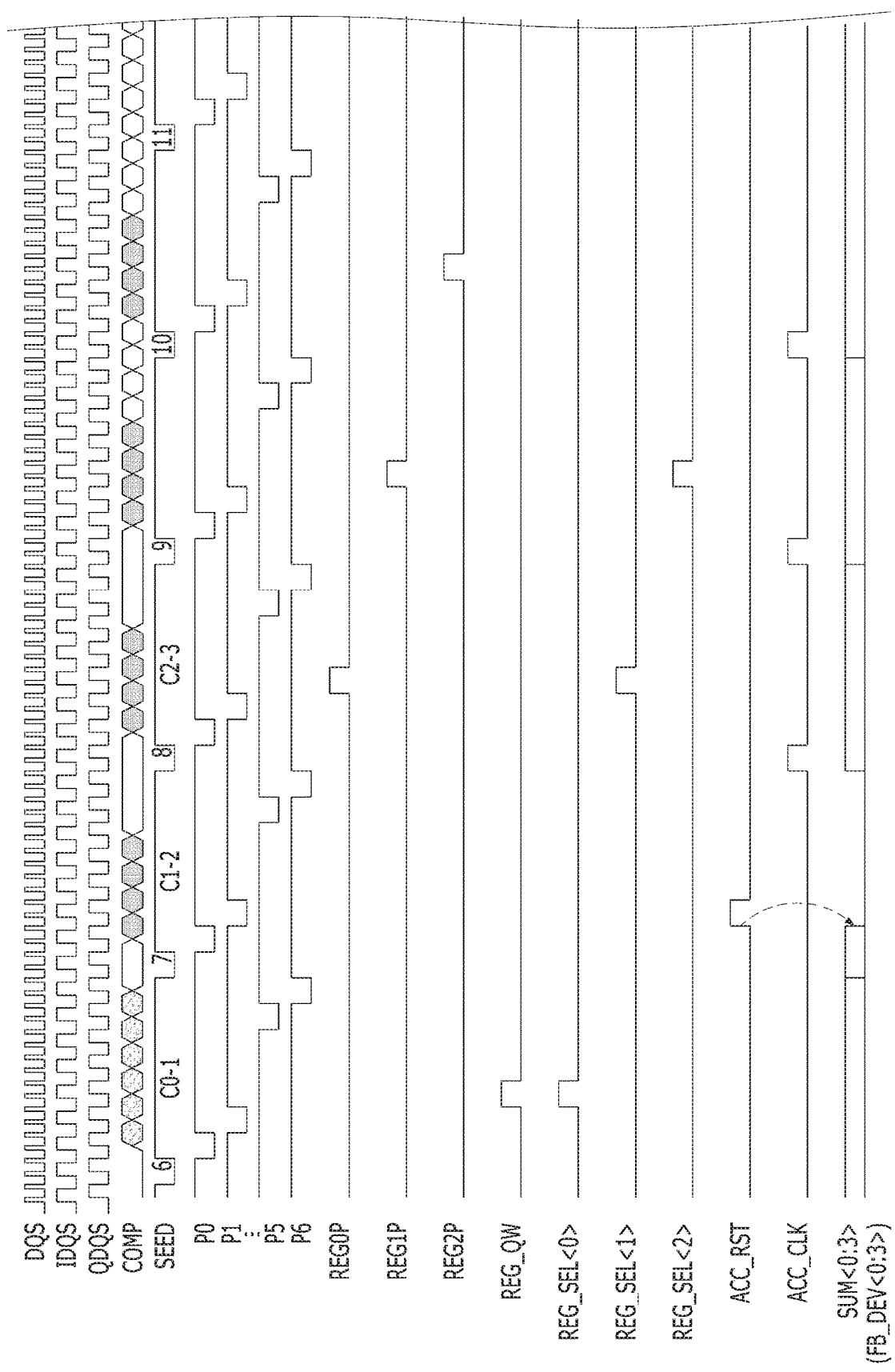

SEMICONDUCTOR DEVICE INCLUDING A CALIBRATION CIRCUIT CAPABLE OF GENERATING STROBE SIGNALS AND CLOCK SIGNALS HAVING ACCURATE DUTY RATIO AND TRAINING METHOD THEREOF

CROSS-REFERENCE TO RELATED APPLICATION

This application claims priority under 35 U.S.C. § 119(a) to Korean Patent Application No. 10-2019-0031885, filed on Mar. 20, 2019, the disclosure of which is incorporated herein by reference in its entirety.

BACKGROUND

1. Field

Various embodiments of the present invention relate to a semiconductor design technique, and more particularly, to a calibration circuit of a semiconductor device that inputs and outputs data according to a strobe signal.

2. Description of the Related Art

Generally, a semiconductor device has a data output buffer for a data output operation. The data output buffer performs a function of outputting data transferred through a global input and output (input/output) line in synchronization with a strobe signal. The strobe signal may be generated using a rising clock activated according to a rising edge of an output clock or a falling clock activated according to a falling edge of the output clock. A strobe signal generation circuit may be provided to generate the strobe signal.

Generally, a delay locked loop (DLL) circuit generates an output clock leading an external clock by a predetermined time, in order to compensate for a delay value of delay elements in a semiconductor device. Then, the DLL circuit divides the output clock into a rising clock and a falling clock, and adjusts the duty ratios of the rising and falling clocks to 50%. Ideally, the duty ratio of each of the rising and falling clocks transmitted to the strobe signal generation circuit should remain unchanged. In reality, however, a process, voltage, temperature (PVT) variation and resistance and noise in a transmission line of the clock may change the duty ratio. If the strobe signal is generated in a state where the duty ratio of each of the rising and falling clocks is not 50%, an activation period of the strobe signal may be changed resulting in inaccurate control of the data output buffer. Even worse, a malfunction in which the data output operation is not performed may occur.

SUMMARY

Various embodiments are directed to a semiconductor device including a calibration circuit capable of generating a strobe signal having an accurate duty ratio.

In accordance with an embodiment, a semiconductor device includes: a transmission circuit suitable for sequentially outputting pulses corresponding to first to $N^{th}$ output clocks to a data strobe pad in a training mode; a receiving circuit suitable for generating a rising signal and a falling signal, which are activated respectively at a rising edge and a falling edge of each of the pulses; a calibration circuit suitable for sequentially storing a detection code corresponding to a phase difference between the rising signal and the falling signal in first to $N^{th}$ registers to calculate an average value of first to $N^{th}$ stored values, according to a period signal, and restoring respective deviations between the average value and each of the first to $N^{th}$ stored values in the first to $N^{th}$ registers; and a clock generation circuit suitable for adjusting duty ratios of the first to $N^{th}$ output clocks, using re-stored values of the first to $N^{th}$ registers.

In accordance with an embodiment, a method of operating a semiconductor device includes: sequentially outputting pulses corresponding to first to $N^{th}$ output clocks to a data strobe pad in a training mode; generating a rising signal and a falling signal which are activated respectively at a rising edge and a falling edge of each of the pulses; sequentially storing a detection code corresponding to a phase difference between the rising signal and the falling signal in first to $N^{th}$ registers, and generating a sum signal by summing up first to $N^{th}$ stored values; calculating an average value of the first to $N^{th}$ stored values based on the sum signal, and restoring deviations between the average value and the first to $N^{th}$ stored values in the first to $N^{th}$ registers; and adjusting duty ratios of the first to $N^{th}$ output docks, using re-stored values of the first to $N^{th}$ registers.

In accordance with an embodiment, a calibration circuit includes: a detection circuit suitable for generating a detection code by detecting a phase difference between a rising signal and a falling signal; a storage suitable for selecting the detection code or a combined deviation code according to a period signal, and storing the selected code in first to $N^{th}$ registers according to first to $N^{th}$ register control signals; a summing component suitable for outputting a sum signal by summing up first to $N^{th}$ stored values stored in the first to $N^{th}$ registers or outputting the combined deviation code by summing up a deviation code, according to the first to $N^{th}$ register control signals and the period signal; an average calculating component suitable for calculating an average value based on the sum signal; and a deviation calculating component suitable for selecting one of the first to $(N-1)^{th}$ stored values according to a selection signal, and outputting a difference between the average value and the selected stored value as the deviation code.

In accordance with an embodiment, a semiconductor device includes: a clock generation circuit suitable for generating a plurality of clocks, two of which have a phase difference; a transmission circuit suitable for receiving multiple pattern data, serializing the multiple pattern data and transmitting, to a data strobe pad, the serialized pattern data as training pulses synchronized with the plurality of clocks; a receiving circuit suitable for receiving the training pulses and generating a rising signal and a falling signal corresponding to each of the training pulses; and a calibration circuit suitable for detecting a pulse width of each of the training pulses, based on a phase difference between the rising signal and the falling signal, determining an average value and deviation values for pulse widths of the training pulses, each of the deviation values corresponding to a difference value between a respective one of the pulse widths and the average value, and correcting duty ratios of the plurality of clocks based on the deviation values.

BRIEF DESCRIPTION OF THE DRAWINGS

FIGS. 16A and 16B are timing diagrams illustrating operations of the calibration circuit and the calibration control circuit shown in FIG. 5.

DETAILED DESCRIPTION

Figure 1:
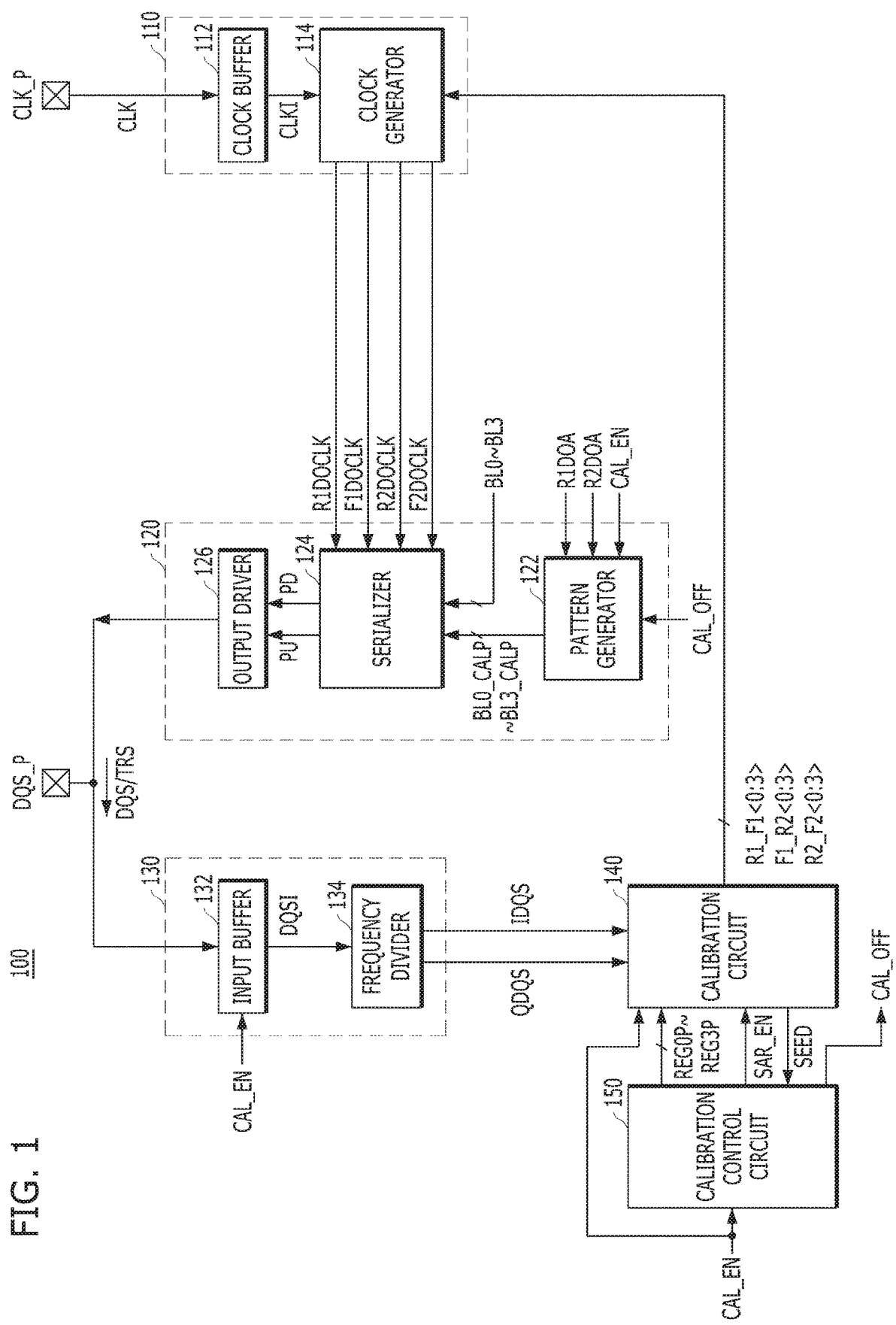
FIG. 1 is a block diagram illustrating a semiconductor device in accordance with an embodiment of the present invention.

Various embodiments of the present invention are described below in more detail with reference to the accompanying drawings. The present invention may, however, be embodied in different forms and should not be construed as limited to the embodiments set forth herein. Rather, these embodiments are provided so that this disclosure is thorough and complete and will fully conveys the scope of the present invention to those skilled in the art. Throughout the disclosure, like reference numerals refer to like parts throughout the various figures and embodiments of the present invention. Also, throughout the specification, reference to "an embodiment" or the like is not necessarily to only one embodiment, and different references to any such phrase are not necessarily to the same embodiment(s).

FIG. 1 is a block diagram illustrating a semiconductor device 100 in accordance with an embodiment of the present invention.

Referring to FIG. 1, the semiconductor device 100 may include a clock generation circuit 110, a transmission circuit 120, a receiving circuit 130 and a calibration circuit 140.

The clock generation circuit 110 may generate output clocks R1DOCLK, F1DOCLK, R2DOCLK and F2DOCLK based on a clock CLK inputted from an external device through a clock pad CLK_P. The output clocks R1DOCLK, F1DOCLK, R2DOCLK and F2DOCLK may be multi-phase clocks activated with a set phase difference, which may be predetermined. A configuration in which the output clocks R1DOCLK, F1DOCLK, R2DOCLK and F2DOCLK are 4-phase clocks is described below as an example. In this case, the output clocks R1DOCLK, F1DOCLK, R2DOCLK and F2DOCLK may include the first to fourth output clocks R1DOCLK, F1DOCLK, R2DOCLK and F2DOCLK activated with a four-phase difference of approximately 90 degree (°).

More specifically, the clock generation circuit 110 may include a clock buffer 112 and a clock generator 114.

The clock buffer 112 may buffer the clock CLK inputted from the external device through the clock pad CLK_P, and output an internal clock CLKI. The clock generator 114 may generate the first to fourth output clocks R1DOCLK, F1DOCLK, R2DOCLK and F2DOCLK that are activated with the four-phase difference of approximately 90 degree, based on the internal clock CLKI. The clock generator 114 of the clock generation circuit 110 may adjust duty ratios of the first to fourth output clocks R1DOCLK, F1DOCLK, R2DOCLK and F2DOCLK according to first to third calibration codes R1_F1<0:3>, F1_R2<0:3> and R2_F2<0:3>.

The transmission circuit 120 may latch first to fourth input data BL0 to BL3 according to the first to fourth output clocks R1DOCLK, F1DOCLK, R2DOCLK and F2DOCLK, respectively, and generate a strobe signal DQS that toggles in a set cycle, during a normal operation (i.e. read operation). The transmission circuit 120 may output the strobe signal DQS to a data strobe pad DQS_P. Each of the first to fourth input data BL0 to BL3 may be a signal that maintains a logic high level or a logic low level.

Figure 2A:
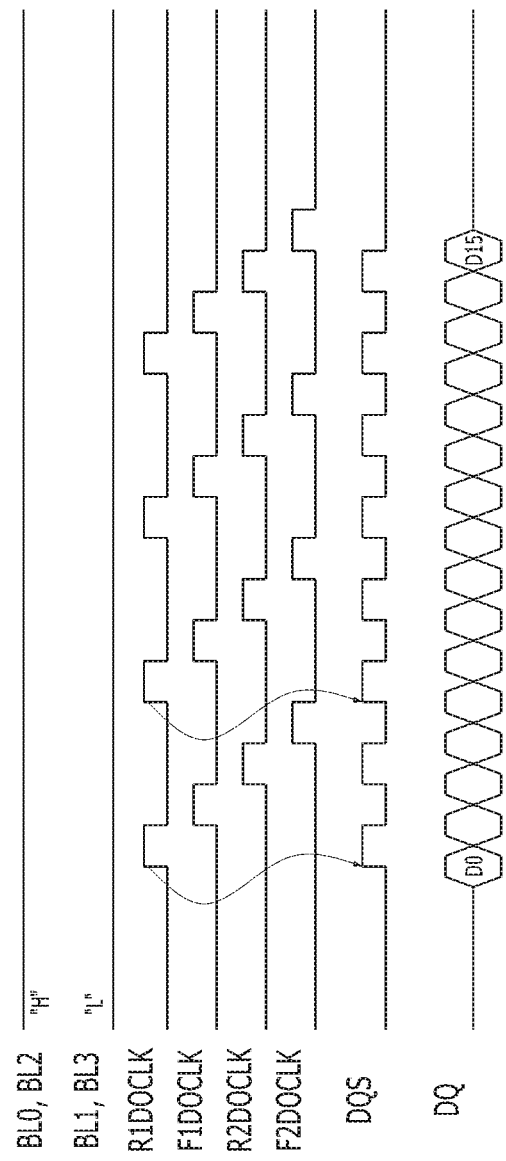
FIGS. 2A and 2B are timing diagrams illustrating operations of a transmission circuit shown in FIG. 1.

FIG. 2A illustrates an operation of the transmission circuit 120 shown in FIG. 1.

As illustrated in FIG. 2A, when a burst length BL is 16, the first and third input data BL0 and BL2 having a logic high level "H" and the second and fourth input data BL1 and BL3 having a logic low level "L" may be provided. The transmission circuit 120 may latch the first to fourth input data BL0 to BL3 four times according to the first to fourth output clocks R1DOCLK, F1DOCLK, R2DOCLK and F2DOCLK, respectively, and generate the strobe signal DQS that toggles 16 times in order of H-L-H-L-H-L-H-L-H-L-H-L-H-L-H-L. A data output buffer (not illustrated) may sequentially output 16 output data D0 to D15 to the external device through a data input/output DQ pad according to rising and falling edges of the strobe signal DQS. At this time, the output data D0, D4, D8 and D12 may be outputted in synchronization with the first output clock R1DOCLK, the output data D1, D5, D9 and D13 may be outputted in synchronization with the second output clock F1DOCLK, the output data D2, D6, D10 and D14 may be outputted in synchronization with the third output clock R2DOCLK, and the output data D3, D7, D11 and D15 may be outputted in synchronization with the fourth output clock F2DOCLK.

Referring back to FIG. 1, the transmission circuit 120 may sequentially output pulses corresponding to the first to fourth output clocks R1DOCLK, F1DOCLK, R2DOCLK and F2DOCLK to the data strobe pad DQS_P in a training mode. In the training mode, the transmission circuit 120 may generate first to fourth pattern data BL0_CALP to BL3_CALP according to first and second test signals R1DOA and R2DOA. Further, the transmission circuit 120 may output a training signal TRS activated in a set pattern by latching the first to fourth pattern data BL0_CALP to BL3_CALP according to the first to fourth output clocks R1DOCLK, F1DOCLK, R2DOCLK and F2DOCLK, respectively. The transmission circuit 120 may output the training signal TRS to the data strobe pad DQS_P. The first to fourth pattern data BL0_CALP to BL3_CALP may be signals that sequentially maintain a logic high level for set periods of the first and second test signals R1DOA and R2DOA. The first to fourth pattern data BL0_CALP to BL3_CALP may have activation periods that do not overlap with one another.

Figure 2B:
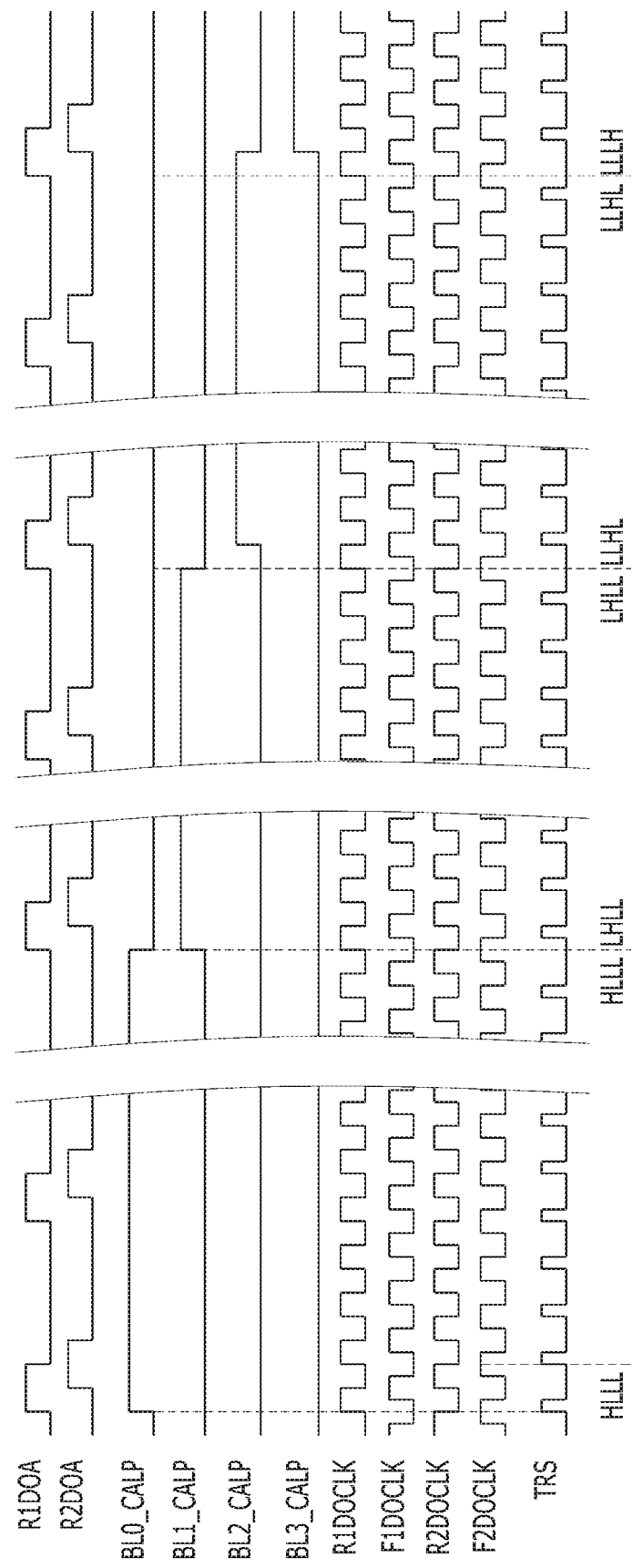

FIG. 2B illustrates an operation of the transmission circuit 120 in the training mode.

As illustrated in FIG. 2B, in the training mode, the first and second test signals R1DOA and R2DOA are inputted with a set phase difference in the same cycle. The first and second test signals R1DOA and R2DOA may have periods twice as long as those of the first to fourth output clocks R1DOCLK, F1DOCLK, R2DOCLK and F2DOCLK. The transmission circuit 120 may generate the first pattern data BL0_CALP activated for a set period of the first test signal R1DOA. The transmission circuit 120 may generate the second pattern data BL1_CALP activated for a set period of the first test signal R1DOA after the first pattern data BL0_CALP is deactivated. The transmission circuit 120 may generate the third pattern data BL2_CALP activated for a set period of the second test signal R2DOA after the second pattern data BL1_CALP is deactivated. The transmission circuit 120 may generate the fourth pattern data BL3_CALP activated for a set period of the second test signal R2DOA after the third pattern data BL2_CALP is deactivated.

The transmission circuit 120 may latch the first to fourth pattern data BL0_CALP to BL3_CALP according to the first to fourth output clocks R1DOCLK, F1DOCLK, R2DOCLK and F2DOCLK, respectively, and generate the training signal TRS activated in the set pattern. In other words, assuming that a logic high level "H" is defines as a first level (FL), and a logic low level "L" is defined as a second level (SL), the training signal TRS may be outputted as pulses of FL-SL-SL-SL for an activation period of the first pattern data BL0_CALP, pulses of SL-FL-SL-SL for an activation period of the second pattern data BL1_CALP, pulses of SL-SL-FL-SL for an activation period of the third pattern data BL2_CALP and pulses of SL-SL-SL-FL for an activation period of the fourth pattern data BL3_CALP.

Referring back to FIG. 1, the transmission circuit 120 may include a pattern generator 122, a serializer 124 and an output driver 126.

The pattern generator 122 may be enabled according to a training mode signal CAL_EN activated in the training mode, and disabled according to a training end signal CAL_OFF indicating that a training operation is terminated. The pattern generator 122 may generate the first to fourth pattern data BL0_CALP to BL3_CALP using the first and second test signals R1DOA and R2DOA. For example, the pattern generator 122 may generate the first and second pattern data BL0_CALP and BL1_CALP that are sequentially activated for a set period of the first test signal R1DOA, and then generate the third and fourth pattern data BL2_CALP and BL3_CALP that are sequentially activated for a set period of the second test signal R2DOA. The first to fourth pattern data BL0_CALP to BL3_CALP may have activation periods that do not overlap with one another.

The serializer 124 may latch the first to fourth input data BL0 to BL3 or the first to fourth pattern data BL0_CALP to BL3_CALP according to the first to fourth output clocks R1DOCLK, F1DOCLK, R2DOCLK and F2DOCLK, respectively. Further, the serializer 124 may serialize the latched signals to generate a pull-up control signal PU and a pull-down control signal PD. During a read operation, the serializer 124 may latch the first to fourth input data BL0 to BL3 according to the first to fourth output clocks R1DOCLK, F1DOCLK, R2DOCLK and F2DOCLK, respectively, and serialize the latched signals to generate the pull-up control signal PU and the pull-down control signal PD. In the training mode, however, the serializer 124 may latch the first to fourth pattern data BL0_CALP to BL3_CALP according to the first to fourth output clocks R1DOCLK, F1DOCLK, R2DOCLK and F2DOCLK, respectively. Further, the serializer 124 may serialize the latched signals to generate the pull-up control signal PU and the pull-down control signal PD.

The output driver 126 may output the strobe signal DQS and the training signal TRS by driving the data strobe pad DQS_P according to the pull-up control signal PU and the pull-down control signal PD.

The receiving circuit 130 may generate a rising signal IDQS and a falling signal QDQS which are activated respectively at a rising edge and a falling edge of the strobe signal DQS inputted to the data strobe pad DQS_P in a normal operation, i.e., a write operation. The receiving circuit 130 may generate a rising signal IDQS and a falling signal QDQS which are respectively activated at a rising edge and a falling edge of the training signal TRS inputted to the data strobe pad DQS_P in the training mode. At this time, the receiving circuit 130 may generate the rising signal IDQS and the falling signal QDQS to have periods twice as long as that of the strobe signal DQS. In general, the receiving circuit 130 is activated only in the write operation. However, the receiving circuit 130 may be enabled even in the training mode, and receive the training signal TRS inputted to the data strobe pad DQS_P.

More specifically, the receiving circuit 130 may include an input buffer 132 and a frequency divider 134.

The input buffer 132 may buffer the strobe signal DQS inputted to the data strobe pad DQS_P in the write operation. The input buffer 132 may buffer the training signal TRS inputted to the data strobe pad DQS_P in the training mode. The input buffer 132 may output the buffered signal as an internal strobe signal DQSI. The input buffer 132 may be enabled according to the training mode signal CAL_EN.

The frequency divider 134 may divide the frequency of the internal strobe signal DQSI by a set number, for example, 2, and output the rising signal IDQS and the falling signal QDQS which are activated at rising and falling edges of the divided signal, respectively. For example, the frequency divider 134 may generate the first rising signal IDQS activated at a rising edge of the internal strobe signal DQSI by dividing the frequency of the internal strobe signal DQSI by two. The frequency divider 134 may generate the second rising signal IDQSB by inverting the first rising signal IDQS, generate the first falling signal QDQS activated at a falling edge of the internal strobe signal DQSI, and generate the second falling signal QDQSB by inverting the first falling signal QDQS. In the present embodiment, the frequency divider 134 uses the first rising signal IDQS and the first falling signal QDQS in the training operation. However, the present invention is not limited to this specific configuration.

The calibration circuit 140 may sequentially output a detection code (not illustrated) corresponding to a phase difference between the rising signal IDQS and the falling signal QDQS to first to fourth registers (not illustrated) according to a period signal SAR_EN. The calibration circuit 140 may calculate an average value of first to fourth stored values of the first to fourth registers, and re-store deviations between the average value and the first to fourth stored values in the first to fourth registers, respectively, according to the period signal SAR_EN. The first to fourth stored values re-stored respectively in the first to fourth registers may be outputted as first to third calibration codes R1_F1<0:3>, F1_R2<0:3> and R2_F2<0:3>. The calibration circuit 140 may be enabled according to the training mode signal CAL_EN.

The semiconductor device 100 may further include a calibration control circuit 150 for controlling the calibration circuit 140. The calibration control circuit 150 may be enabled according to the training mode signal CAL_EN, and generate the period signal SAR_EN and first to fourth register control signals REG0P to REG0P which are sequentially activated, according to a seed signal SEED activated in a set cycle based on at least one of the rising signal IDQS and the falling signal QDQS. For example, the calibration control circuit 150 may be enabled according to the training mode signal CAL_EN, and generate the period signal SAR_EN which is deactivated after the seed signal SEED is activated a set number of times. In addition, the calibration control circuit 150 may generate the training end signal CAL_OFF which is activated after the calibration circuit 140 re-stores the deviations of the first to fourth stored values in the first to fourth registers.

When the period signal SAR_EN is activated, the calibration circuit 140 may sequentially store the detection code in the first to fourth registers according to the first to fourth register control signals REG0P to REG3P. Further, the calibration circuit 140 may generate a sum signal (not illustrated) by summing up the first to fourth stored values. In addition, when the period signal SAR_EN is deactivated, the calibration circuit 140 may calculate the average value based on the sum signal, and sequentially re-store the deviations corresponding to the first to fourth stored values in the first to fourth registers according to the first to fourth register control signals REG0P to REG3P. Finally, the first to fourth registers may output the re-stored first to fourth storage values as the first to third calibration codes R1_F1<0:3>, F1_R2<0:3> and R2_F2<0:3>. A configuration and arrangement in which the calibration circuit 140 calculates the average value of the first to fourth stored values, re-stores the deviations between the average value and the first to third stored values in the first to third registers and outputs the re-stored values as the first to third calibration codes R1_F1<0:3>, F1_R2<0:3> and R2_F2<0:3> is described below as an example. However, the present invention is not limited thereto; the calibration circuit 140 may re-store the deviations between the average value and the first to fourth stored values in the first to fourth registers in various ways.

FIG. 1 illustrates that the calibration circuit 140 generates the seed signal SEED according to at least one of the rising signal IDQS and the falling signal QDQS, and the calibration control circuit 150 generates the first to fourth register control signals REG0P to REG3P and the period signal SAR_EN according to the seed signal SEED. However, the present invention is not limited thereto; the calibration control circuit 150 may generate the seed signal SEED according to at least one of the rising signal IDQS and the falling signal QDQS. In addition, the calibration control circuit 150 may generate control signals for controlling the calibration circuit 140 other than the first to fourth register control signals REG0P to REG3P and the period signal SAR_EN. Detailed description thereof is provided below with reference to FIG. 5.

As described above, the semiconductor device in accordance with the present embodiment may sequentially output the training signal composed of the pulses corresponding to the output clocks to the data strobe pad, and the training signal finally transmitted through the data strobe pad may be fed back to the semiconductor device, in the training mode. In addition, the semiconductor device may detect the respective pulse widths of the fed-back pulses by measuring the phase difference between the rising signal IDQS and the falling signal QDQS corresponding to the rising edges and the falling edges of the fed-back pulses. The semiconductor device may store the detected pulse widths in the registers, calculate the average value and the deviations using the stored values, and individually adjust the duty ratios of the respective output clocks, thereby constantly maintaining the 1-bit pulse width of the strobe signal.

Figure 3:
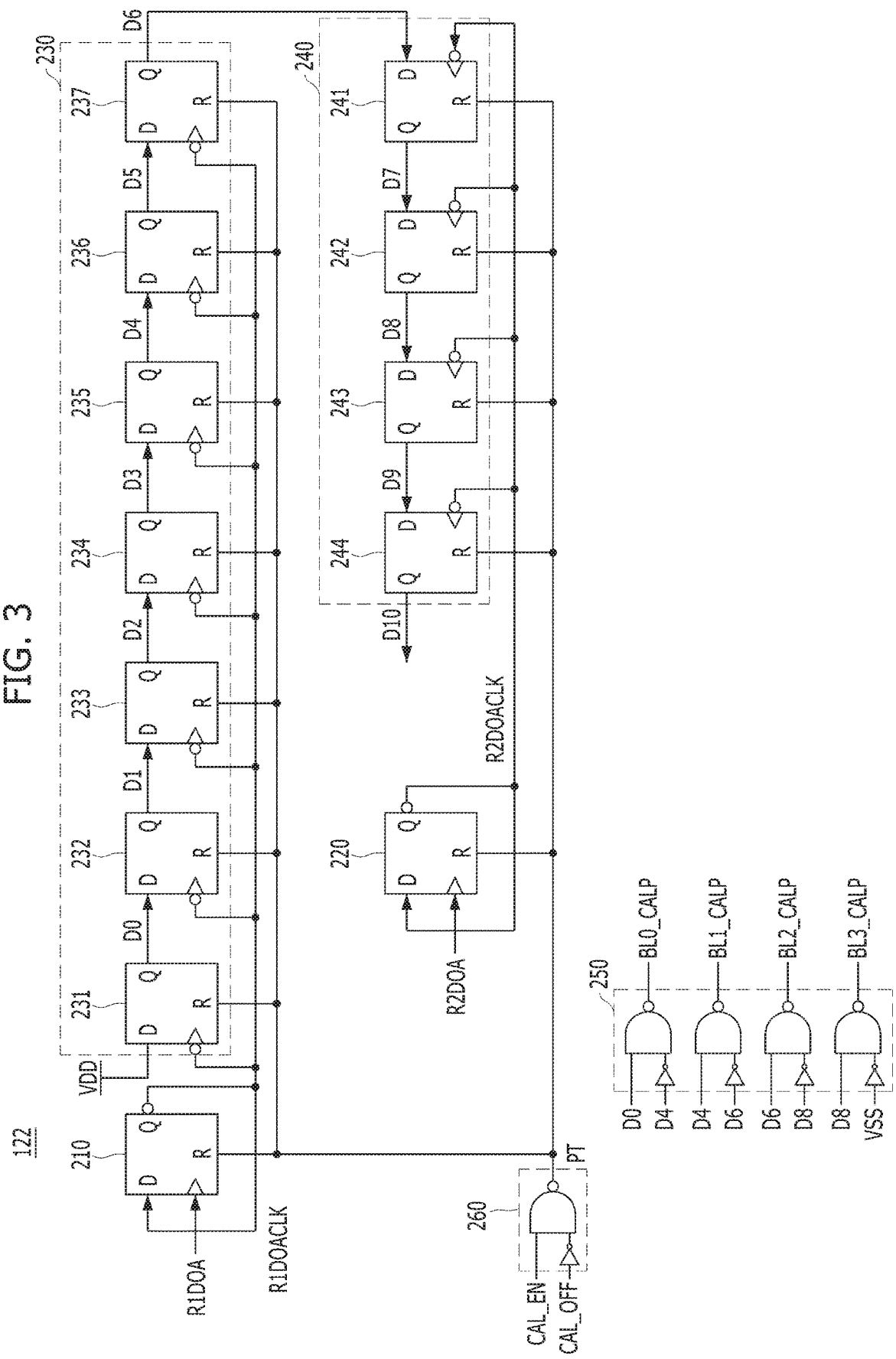
FIG. 3 is a circuit diagram illustrating a pattern generator shown in FIG. 1.

FIG. 3 is a circuit diagram illustrating the pattern generator 122 shown in FIG. 1.

Referring to FIG. 3, the pattern generator 122 may include a first frequency divider 210, a second frequency divider 220, a first signal generator 230, a second signal generator 240 and a pattern combiner 250. The pattern generator 122 may further include a reset controller 260 to generate a pattern period signal PT by performing a logic NAND operation on the training mode signal CAL_EN and an inverted signal of the training end signal CAL_OFF. The first frequency divider 210, the second frequency divider 220, the first signal generator 230 and the second signal generator 240 may be reset according to the pattern period signal PT.

The first frequency divider 210 may generate a first divided clock R1DOACLK by dividing the frequency of the first test signal R1DOA by a set cycle, for example, 2. The second frequency divider 220 may generate a second divided clock R2DOACLK by dividing the frequency of the second test signal R2DOA by a set cycle, for example, 2. Each of the first and second frequency dividers 210 and 220 may be composed of a D flip-flop that receives a corresponding signal of the first and second test signals R1DOA and R2DOA through a clock terminal, receives an inverted signal of an output terminal Q through an input terminal D, and receives the pattern period signal PT as a reset signal R.

The first signal generator 230 may generate first to seventh shift signals D0 to D6 which are sequentially activated according to the first divided clock R1DOACLK. The first signal generator 230 may be composed of first to seventh shifters 231 to 237 that are coupled in series to one another and output the first to seventh shift signals D0 to D6, respectively, in synchronization with falling edges of the first divided clock R1DOACLK. Each of the first to seventh shifters 231 to 237 may be composed of a D flip-flop that receives an inverted signal of the first divided clock R1DOACLK through a clock terminal, receives a signal of an output terminal Q of a previous stage through an input terminal D, and receives the pattern period signal PT as the reset signal R. The first shifter 231 may receive a power source voltage VDD at the input terminal D.

The second signal generator 240 may receive an output of the first signal generator 230, that is, the seventh shift signal D6, and generate eighth to 11$^{th}$ shift signals D7 to D10 which are sequentially activated according to the second divided clock R2DOACLK. The second signal generator 240 may include eighth to 11$^{th}$ shifters 241 to 244 that are coupled in series to one another and output the eighth to 11$^{th}$ shift signals D7 to D10, respectively, in synchronization with falling edges of the second divided dock R2DOACLK. Each of the eighth to 11$^{th}$ shifters 241 to 244 may be composed of a D flip-flop that receives an inverted signal of the second divided clock R2DOACLK through a clock terminal, receives a signal of an output terminal Q of a previous stage through an input terminal D, and receives the pattern period signal PT as the reset signal R. The eighth shifter 241 may receive the seventh shift signal D6 through the input terminal D.

The pattern combiner 250 may combine at least two of the first to 11$^{th}$ shift signals D0 to D10 to output the first to fourth pattern data BL0_CALP to BL3_CALP. In various embodiments, the pattern combiner 250 may combine one of the first to seventh shift signals D0 to D6 outputted from the first signal generator 230 with one of the eighth to 11$^{th}$ shift signals D7 to D10 outputted from the second signal generator 240, and output the combined signal as one of the first to fourth pattern data BL0_CALP to BL3_CALP. For example, the pattern combiner 250 may generate the first pattern data BL0_CALP by performing a logic AND operation on the first shift signal D0 and an inverted signal of the fifth shift signal D4. The pattern combiner 250 may generate the second pattern data BL1_CALP by performing the logic AND operation on the fifth shift signal D4 and an inverted signal of the seventh shift signal D6. The pattern combiner 250 may generate the third pattern data BL2_CALP by performing the logic AND operation on the seventh shift signal D6 and an inverted signal of the ninth shift signal D8. The pattern combiner 250 may generate the fourth pattern data BL3_CALP by performing the logic AND operation on the ninth shift signal D8 and a ground voltage VSS.

Figure 4:
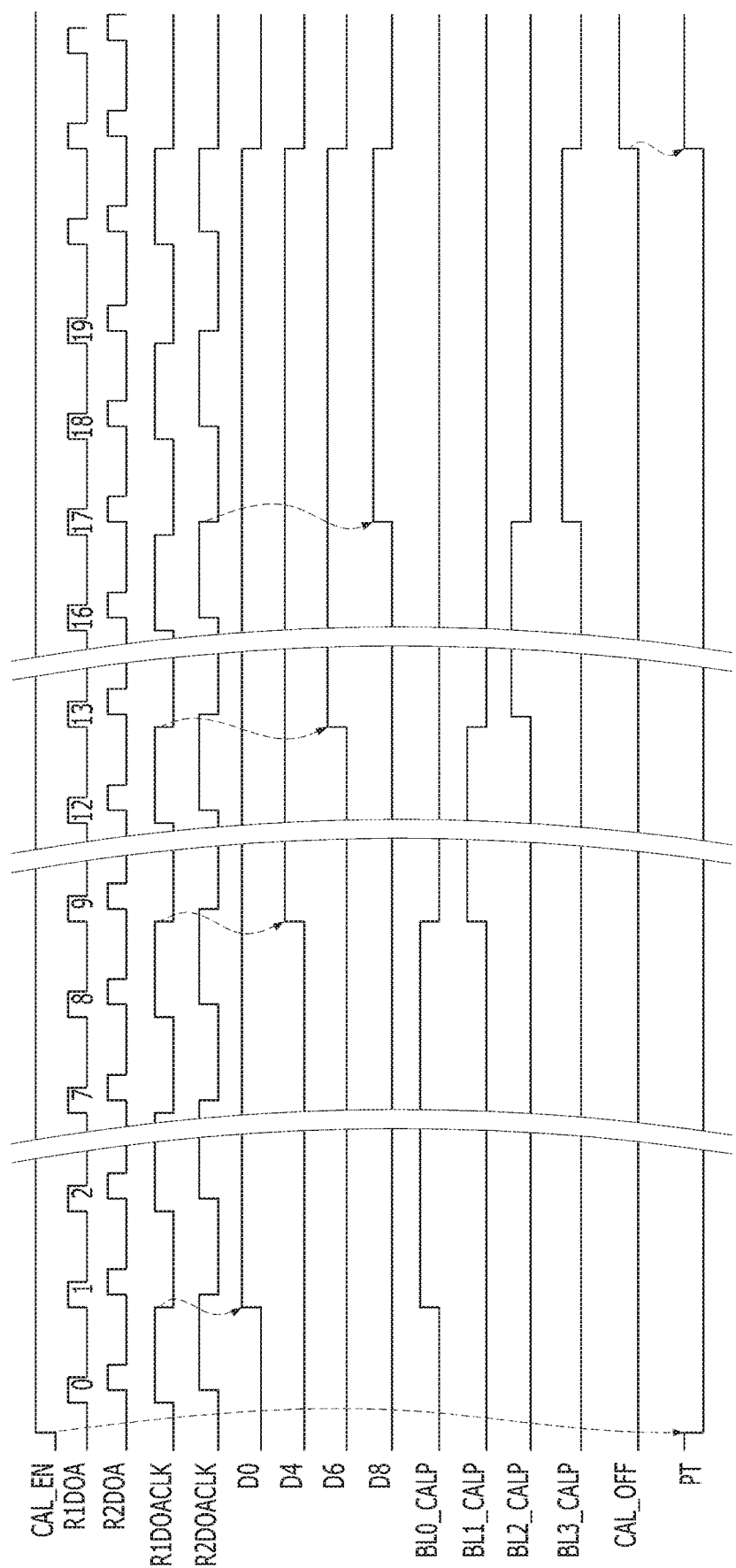
FIG. 4 is a timing diagram illustrating an operation of the pattern generator shown in FIG.

FIG. 4 is a timing diagram illustrating an operation of the pattern generator 122 shown in FIG. 3.

Referring to FIG. 4, the reset controller 260 may generate the pattern period signal PT at a logic low level according to the training mode signal CAL_EN.

When the pattern period signal PT is at the logic low level, the first frequency divider 210 may generate the first divided clock R1DOACLK by dividing the first test signal R1DOA by 2, and the second frequency divider 220 may generate the second divided clock R2DOACLK by dividing the second test signal R2DOA by 2. The first signal generator 230 may sequentially activate and output the first to seventh shift signals D0 to D6 according to falling edges of the first divided clock signal R1DOACLK. The second signal generator 240 may sequentially activate and output the eighth to 11$^{th}$ shift signals D7 to D10 according to falling edges of the second divided clock R2DOACLK after the activation of the seventh shift signal D6.

The pattern combiner 250 may generate the first pattern data BL0_CALP having an activation period between a rising edge of the first shift signal D0 and a rising edge of the fifth shift signal D4. The pattern combiner 250 may generate the second pattern data BL1_CALP having an activation period between the rising edge of the fifth shift signal D4 and a rising edge of the seventh shift signal D6. The pattern combiner 250 may generate the third pattern data BL2_CALP having an activation period between the rising edge of the seventh shift signal D6 and a rising edge of the ninth shift signal D8. The pattern combiner 250 may generate the fourth pattern data BL3_CALP having an activation period between the rising edge of the ninth shift signal D8 and a rising edge of the training mode signal CAL_EN.

Subsequently, as the training end signal CAL_OFF is activated to a logic high level, the reset controller 260 may generate the pattern period signal PT at the logic high level.

Since the first frequency divider 210, the second frequency divider 220, the first signal generator 230 and the second signal generator 240 are reset according to the pattern period signal PT, the first to fourth pattern data BL0_CALP to BL3_CALP may be initialized.

As described above, the pattern generator 122 may generate the first to fourth pattern data BL0_CALP to BL3_CALP which are sequentially activated and have activation periods that do not overlap with one another, using the first and second test signals R1DOA and R2DOA.

As illustrated in FIG. 4, the first pattern data BL0_CALP and the fourth pattern data BL3_CALP may be activated for a period at least twice as long as that of the second and third patter data BL1_CALP and BL2_CALP. This is because an initial period of the activation period of the first pattern data BL0_CALP is allocated for an initial trimming setting operation of the calibration circuit 140, and a latter period of the fourth pattern data BL3_CALP is allocated for a deviation calculating operation. Detailed description thereof is provided below with reference to FIG. 5.

Figure 5:
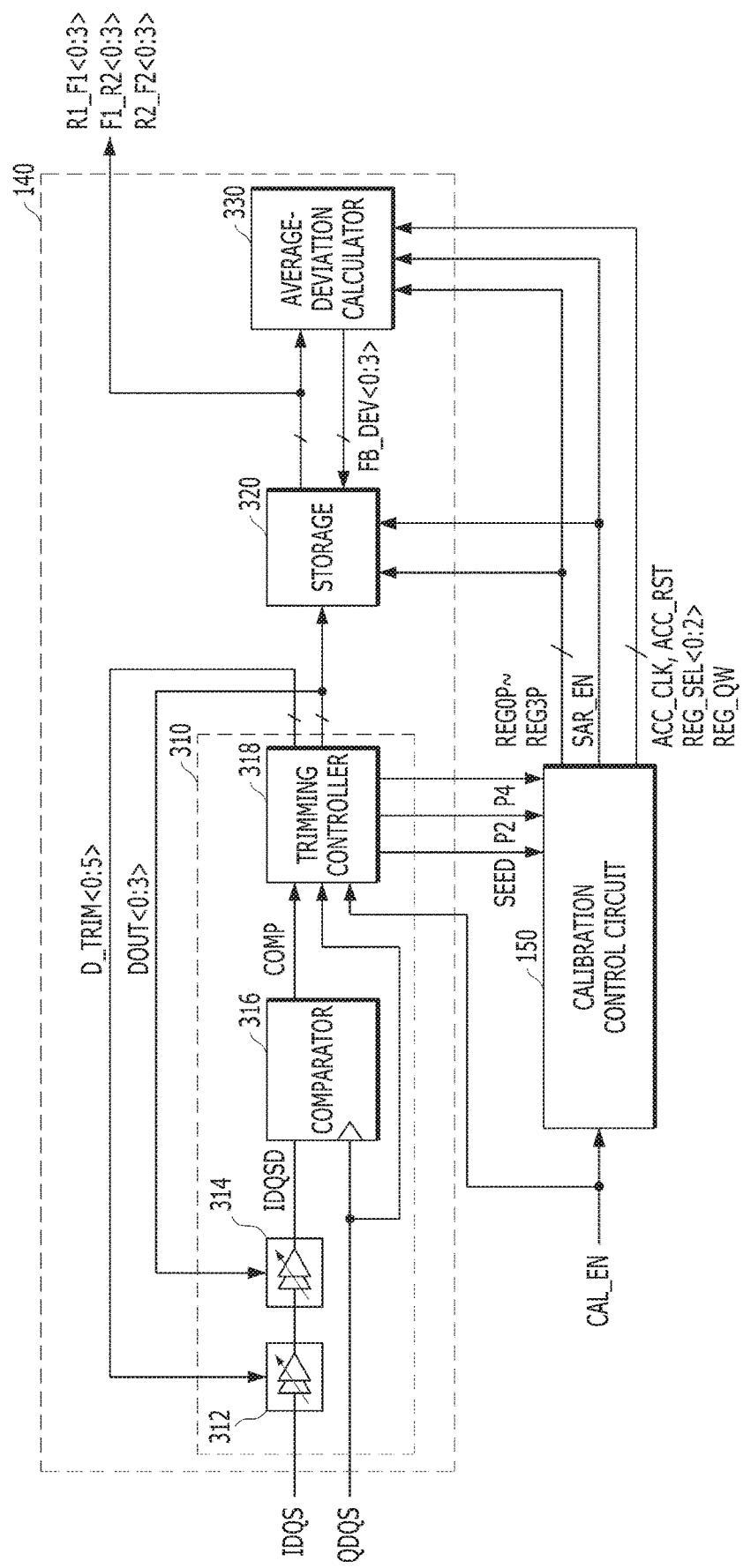
FIG. 5 is a detailed block diagram illustrating a calibration circuit and a calibration control circuit shown in FIG. 1.

FIG. 5 is a detailed block diagram illustrating the calibration circuit 140 and the calibration control circuit 150 shown in FIG. 1.

Referring to FIG. 5, the calibration circuit 140 may include a detection circuit 310, a storage 320 and an average-deviation calculator 330.

The detection circuit 310 may detect a phase difference between the rising signal IDQS and the falling signal QDQS, and generate a detection code DOUT<0:3>.

More specifically, the detection circuit 310 may include a first trimmer 312, a second trimmer 314, a comparator 316 and a trimming controller 318.

The first trimmer 312 may be implemented with a delay line whose delay amount is adjusted according to a trimming code D_TRIM<0:5>. The second trimmer 314 may be implemented with a delay line whose delay amount is adjusted according to the detection code DOUT<0:3>. The first and second trimmers 312 and 314, which are coupled in series to each other, may delay the rising signal IDQS by a set time, and output a delayed rising signal IDQSD. The comparator 316 may compare a phase difference between the delayed rising signal IDQSD and the falling signal QDQS, and output a comparison signal COMP. In various embodiments, the comparator 316 may be composed of a D flip-flop that receives the delayed rising signal IDQSD through an input terminal, receives the falling signal QDQS as a clock signal, and outputs the comparison signal COMP through an output terminal. In other words, the comparator 316 may latch the delayed rising signal IDQSD according to the falling signal QDQS, and output the latched signal as the comparison signal COMP. The trimming controller 318 may generate the seed signal SEED and first to seventh pulse signals P0 to P6 which are activated at a set cycle according to the falling signal QDQS, when the training mode signal CAL_EN is activated. The trimming controller 318 may generate the trimming code D_TRIM<0:5> and the detection code DOUT<0:3> which correspond to the comparison signal COMP, according to the seed signal SEED and the first to seventh pulse signals P0 to P6.

The storage 320 may include the first to fourth registers (not illustrated) which are activated according to the first to fourth register control signals REG0P to REG3P, respectively. The storage 320 may sequentially store the detection code DOUT<0:3> in the first to fourth registers according to the first to fourth register control signals REG0P to REG3P, when the period signal SAR_EN is activated. The storage 320 may sequentially store a combined deviation code FB_DEV<0:3>, which are provided from the average-deviation calculator 330, in the first to fourth registers according to the first to fourth register control signals REG0P to REG3P, when the period signal SAR_EN is deactivated. The combined deviation code FB_DEV<0:3> individually represents multiple deviations combined in a single code.

When the period signal SAR_EN is activated, the average-deviation calculator 330 may generate the sum signal by adding the first to fourth stored values according to the first to fourth register control signals REG0P to REG3P and an accumulation clock ACC_CLK. When the period signal SAR_EN is deactivated, the average-deviation calculator 330 may calculate the average value of the sum signal, and calculate the deviation code FB_DEV<0:3> corresponding to the deviations between the average value and the first to fourth stored values, according to the accumulation clock ACC_CLK, an accumulation reset signal ACC_RST, an average calculation signal REG_QW and a selection signal REG_SEL<0:2>. The average-deviation calculator 330 may provide the combined deviation code FB_DEV<0:3> to the storage 320.

The calibration control circuit 150 may be enabled according to the training mode signal CAL_EN. Further, the calibration control circuit 150 may generate the first to fourth register control signals REG0P to REG3P, the period signal SAR_EN, the accumulation clock ACC_CLK, the accumulation reset signal ACC_RST, the average calculation signal REG_QW and the selection signal REG_SEL<0:2> according to the seed signal SEED and some of the first to seventh pulse signals P0 to P6, for example, the third and fifth pulse signals P2 and P4. Detailed description thereof is provided below with reference to FIG. 8.

For example, during the initial period of the activation period of the first pattern data BL0_CALP described with reference to FIG. 4, the delay amount of the first trimmer 312 may be set according to the trimming code D_TRIM<0:5>. Subsequently, during a latter period of the activation period of the first pattern data BL0_CALP, the activation periods of the second and third pattern data BL1_CALP and BL2_CALP and an initial period of the activation period of the fourth pattern data BL3_CALP, the delay amount of the second trimmer 314 may be adjusted according to the detection code DOUT<0:3>. Below, an operation of setting the delay amount of the first trimmer 312 is defined as an initial trimming setting operation, and an operation of setting the delay amount of the second trimmer 314 is defined as a phase detection operation. Subsequently, during the latter period of the activation period of the fourth pattern data BL3_CALP, an average-deviation calculating operation of the average-deviation calculator 330 may be performed.

As described above, when the training mode signal CAL_EN is activated, the detection circuit 310 of the calibration circuit 140 may perform the initial trimming setting operation to set the delay amount of the first trimmer 312, and then perform the phase detection operation to adjust the delay amount of the second trimmer 314. When the period signal SAR_EN is activated, the storage 320 may sequentially store the detection code DOUT<0:3> in the first to fourth registers. Subsequently, when the period signal SAR_EN is deactivated, the average-deviation calculator 330 may calculate the average value of the first to fourth stored values, calculate the combined deviation code FB_DEV<0:3> corresponding to the deviations between the average value and the first to fourth stored values, and then provide the combined deviation code FB_DEV<0:3> to the storage 320. The storage 320 may sequentially re-store the combined deviation code FB_DEV<0:3> provided from the average-deviation calculator 330 in the first to third registers. The first to third stored values re-stored in the first to third registers may be outputted as the first to third calibration codes R1_F1<0:3>, F1_R2<0:3> and R2_F2<0:3>, respectively.

Figure 6:
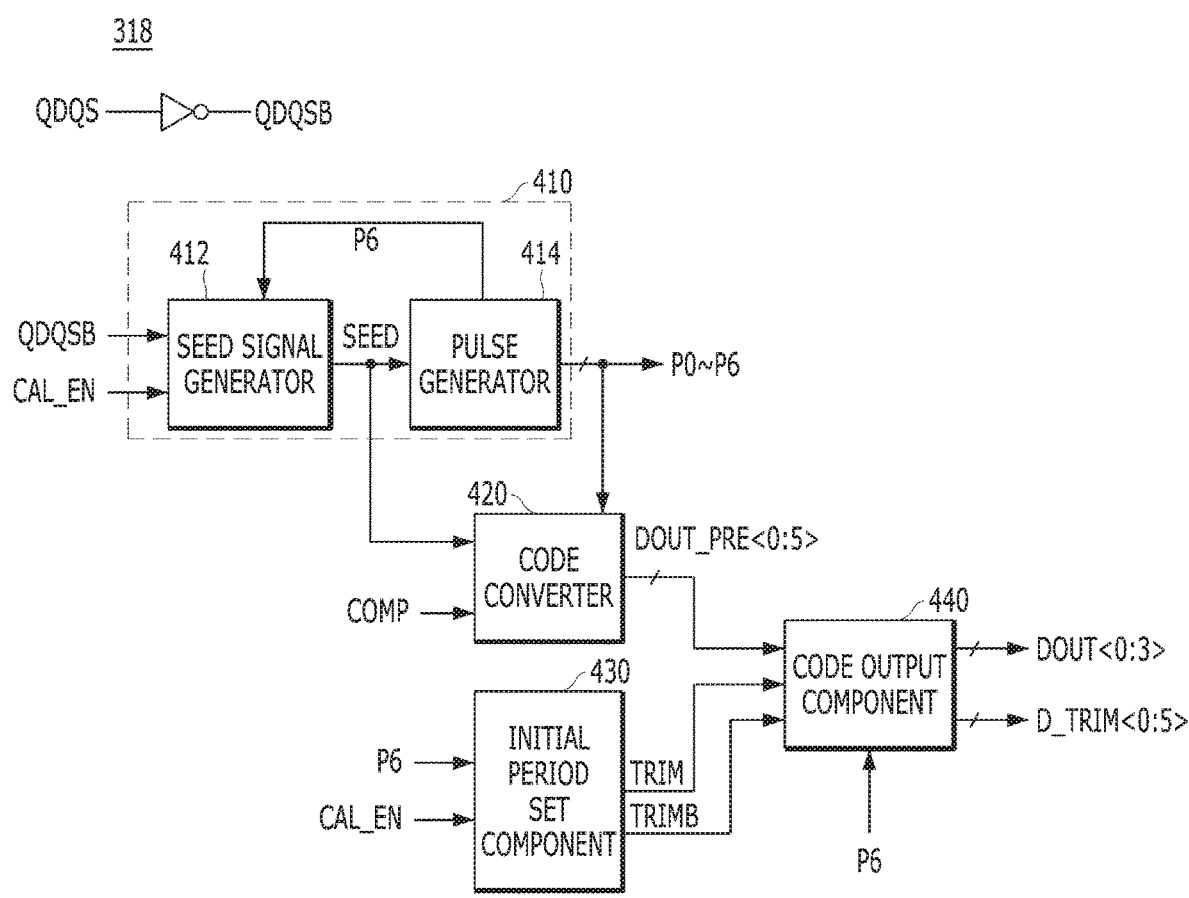
FIG. 6 is a block diagram illustrating a trimming controller shown in FIG. 5.

FIG. 6 is a block diagram illustrating the trimming controller 318 shown in FIG. 5.

Referring to FIG. 6, the trimming controller 318 may include a cycle generator 410, a code converter 420, an initial period set component 430 and a code output component 440.

When the training mode signal CAL_EN is activated, the cycle generator 410 may sequentially activate the seed signal SEED and the first to seventh pulse signals P0 to P6 according to the inverted falling signal QDQSB. The seed signal SEED and the first to seventh pulse signals P0 to P6 may be pulse signals activated at a logic low level for a set period. Although it is described in the present embodiment that the cycle generator 410 uses the inverted falling signal QDQSB, the present invention is not limited thereto; the cycle generator 410 may use one of the falling signal QDQS and the inverted falling signal QDQSB depending on embodiments.

More specifically, the cycle generator 410 may include a seed signal generator 412 and a pulse generator 414.

When the training mode signal CAL_EN is activated, the seed signal generator 412 may activate the seed signal SEED in a set cycle according to the inverted falling signal QDQSB and the seventh pulse signal P6. The pulse generator 414 may generate the first to seventh pulse signals P0 to P6 which are sequentially activated according to deactivation of the seed signal SEED.

The code converter 420 may convert the comparison signal COMP into a preliminary code DOUT_PRE<0:5> according to the seed signal SEED and the first to seventh pulse signals P0 to P6. The code converter 420 may be reset when the seed signal SEED is activated, and convert the comparison signal COMP, which is sequentially inputted according to the first to seventh pulse signals P0 to P6, into the preliminary code DOUT_PRE<0:5>.

The initial period set component 430 may generate a trimming period signal TRIM according to the training mode signal CAL_EN and the seventh pulse signal P6. The initial period set component 430 may generate the trimming period signal TRIM which is set to a logic high level during a deactivation period of the training mode signal CAL_EN, that is, before the training operation, and deactivated to a logic low level according to the seventh pulse signal P6. The initial period set component 430 may also generate an inverted trimming period signal TRIMB by inverting the trimming period signal TRIM. The trimming period signal TRIM, which is a signal for distinguishing the initial trimming setting operation from the phase detection operation, may be activated at the logic high level during the initial period of the activation period of the first pattern data BL0_CALP described with reference to FIG. 4.

The code output component 440 may output the preliminary code DOUT_PRE<0:5> as the trimming code D_TRIM<0:5> or the detection code DOUT<0:3> according to the trimming period signal TRIM and the inverted trimming period signal TRIMB. In the initial trimming setting operation where the trimming period signal TRIM is activated, the code output component 440 may output the preliminary code DOUT_PRE<0:5> as the trimming code D_TRIM<0:5>, and store the preliminary code DOUT_PRE<0:5> in an internal latch (not illustrated) in synchronization with the seventh pulse signal P6. In the phase detection operation where the trimming period signal TRIM is deactivated, the code output component 440 may output the code stored in the latch as the trimming code D_TRIM<0:5>, and output the preliminary code DOUT_PRE<0:5> as the detection code DOUT<0:3>.

Figure 7:
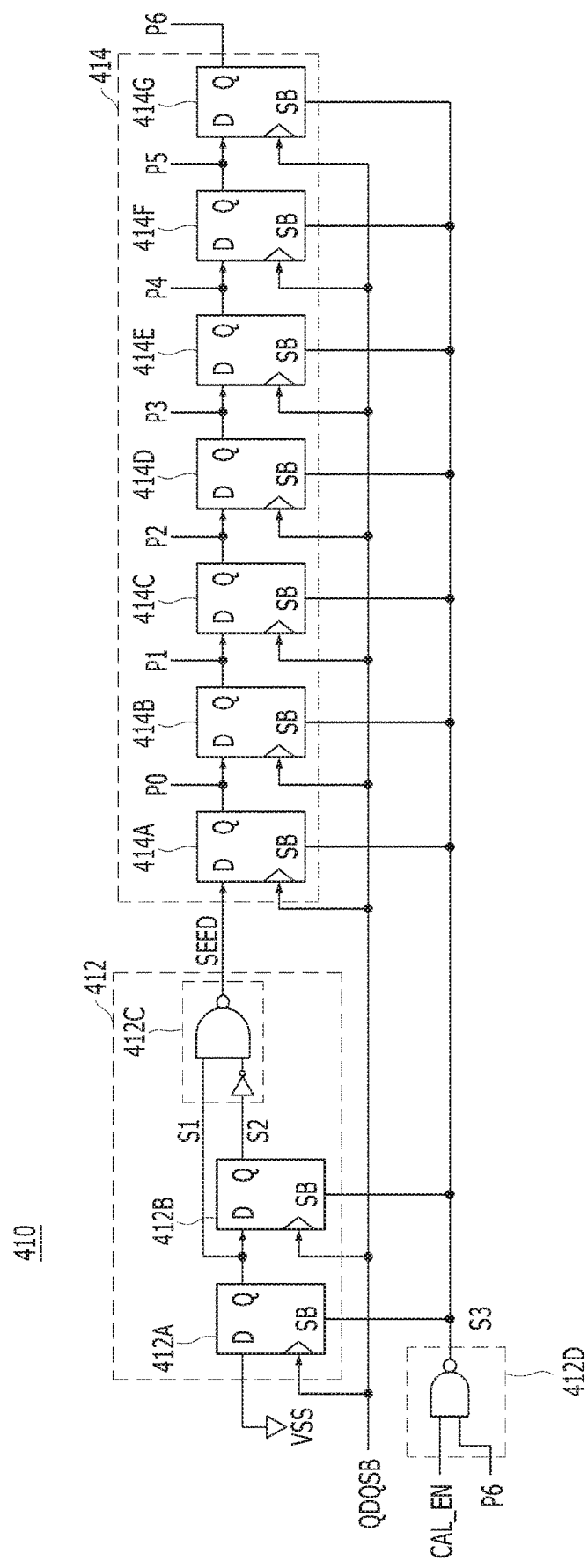
FIG. 7 is a circuit diagram illustrating a cycle generator shown in FIG. 6.

FIG. 7 is a circuit diagram illustrating the cycle generator 410 shown in FIG. 6.

Referring to FIG. 7, the cycle generator 410 may include the seed signal generator 412 and the pulse generator 414. The seed signal generator 412 may include first and second D flip-flips 412A and 412B coupled in series to each other, a seed signal output component 412C and a set combiner 412D.

The first D flip-flip 412A may receive the ground voltage VSS through an input terminal D, receive the inverted falling signal QDQSB as a clock signal, receive a set combination signal S3 as a set bar signal SB, and output a first output signal S1 through an output terminal Q. The second D flip-flip 412B may receive the first output signal S1 through an input terminal D, receive the inverted falling signal QDQSB as the clock signal, receive the set combination signal S3 as the set bar signal SB, and output a second output signal S2 through an output terminal Q. The seed signal output component 412C may combine the first output signal S1 and the second output signal S2, and output the combined signal as the seed signal SEED. The seed signal output component 412C may output the seed signal SEED activated at a logic low level when the first output signal S1 is at a logic high level, and the second output signal S2 is at a logic low level. The set combiner 412D may generate the set combination signal S3 by performing a logic NAND operation on the training mode signal CAL_EN and the seventh pulse signal P6. In other words, the set combiner 412D may output the set combination signal S3 having a logic high level when even one of the training mode signal CAL_EN and the seventh pulse signal P6 becomes a logic low level.

The seed signal generator 412 having the above-described structure may output the seed signal SEED. The seed signal SEED is set to a logic high level during the deactivation period of the training mode signal CAL_EN, that is, before the training operation, and is activated to a logic low level in a set cycle according to the seventh pulse signal P6.

The pulse generator 414 may include third to ninth D flip-flops 414A to 414G coupled in series to one another. Each of the third to ninth D flip-flops 414A to 414G may receive the training mode signal CAL_EN as a set bar signal SB, and receive the inverted falling signal QDQSB as a clock signal. The third D flip-flop 414A may receive the seed signal SEED through an input terminal D, and output the first pulse signal P0 through an output terminal Q. The fourth to ninth D flip-flops 414B to 414G may receive output signals of the respective previous stages through respective input terminals D, and sequentially output the second to seventh pulse signals P1 to P6 through respective output terminals Q.

The pulse generator 414 having the above-described structure may output the first to seventh pulse signals P0 to P6 which are set to a logic high level during the deactivation period of the training mode signal CAL_EN, that is, before the training operation, and sequentially activated to logic low levels according to toggling of the inverted falling signal QDQSB after the seed signal SEED having a logic low level is inputted.

Figure 8:
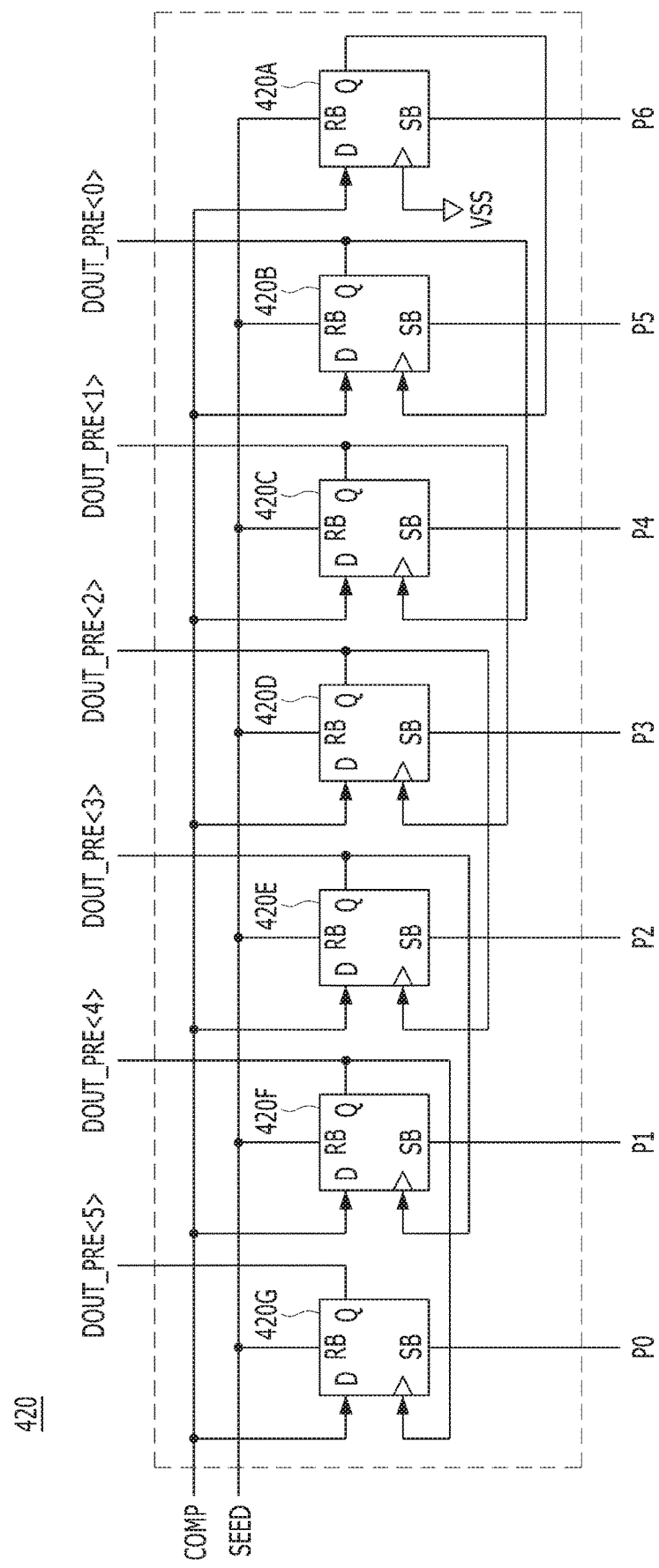
FIG. 8 is a circuit diagram illustrating a code converter shown in FIG. 6.

FIG. 8 is a circuit diagram illustrating the code converter 420 shown in FIG. 6.

Referring to FIG. 8, the code converter 420 may include first to seventh D flip-flops 420A to 420G.

The first to seventh D flip-flops 420A to 420G may receive the comparison signal COMP through respective input terminals D, receive the seed signal SEED as a reset bar signal RB, and receive the seventh to first pulse signals P6 to P0, respectively, as a set bar signal SB. The first D flip-flop 420A may receive the ground voltage VSS as a clock signal. The second to seventh D flip-flops 420B to 420G may receive signals of output terminals Q of the first to sixth D flip-flops 420A to 420F as the clock signals, and output the preliminary code DOUT_PRE<0:5>.

The code converter 420 having the above-described structure may be reset to a logic low level when the see signal SEED is activated, and convert the comparison signal COMP, which is sequentially inputted according to the first to seventh pulse signals P0 to P6, in the reverse order of the preliminary code DOUT_PRE<0:5>. In other words, the code converter 420 may output the comparison signal COMP as a converted preliminary code DOUT_PRE<5:0>.

Figure 9:
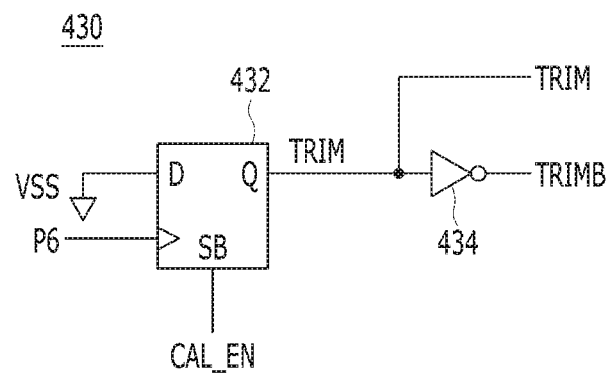
FIG. 9 is a circuit diagram illustrating an initial period set component shown in FIG. 6.

FIG. 9 is a circuit diagram illustrating the initial period set component 430 shown in FIG. 6.

Referring to FIG. 9, the initial period set component 430 may include a D flip-flop 432 and an inverter 434.

The D flip-flop 432 may receive the ground voltage VSS through an input terminal D, receive the training mode signal CAL_EN as a set bar signal SB, receive the seventh pulse signal P6 as a clock signal, and output the trimming period signal TRIM. The inverter 434 may invert the trimming period signal TRIM, and output the inverted trimming period signal TRIMB.

The initial period set component 430 having the above-described structure may generate the trimming period signal TRIM which is set to a logic high level during the deactivation period of the training mode signal CAL_EN, before the training operation, and deactivated at a logic low level according to activation of the seventh pulse signal P6.

Figure 10:
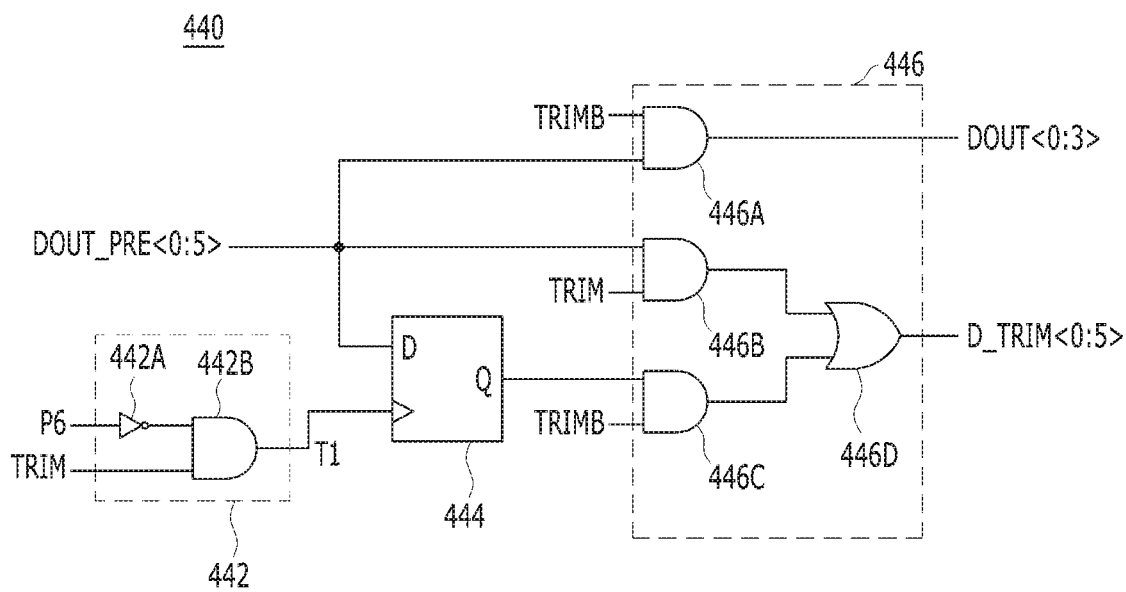
FIG. 10 is a circuit diagram illustrating a code output component shown in FIG. 6.

FIG. 10 is a circuit diagram illustrating the code output component 440 shown in FIG. 6.

Referring to FIG. 10, the code output component 440 may include a timing controller 442, a latch 444 and a selection output component 446.

The timing controller 442 may invert the seventh pulse signal P6, and output a timing signal T1 during an activation period of the trimming period signal TRIM. The timing controller 442 may include an inverter 442A and a first AND gate 442B. The inverter 442A may invert the seventh pulse signal P6. The first AND gate 442B may perform a logic AND operation on an output of the inverter 442A and the trimming period signal TRIM.

The latch 444 may store the preliminary code DOUT_PRE<0:5> according to the timing signal T1.

The selection output component 446 may output the preliminary code DOUT_PRE<0:5> as the trimming code D_TRIM<0:5> or the detection code DOUT<0:3> according to the trimming period signal TRIM and the inverted trimming period signal TRIMB. The selection output component 446 may include second to fourth AND gates 446A to 446C and an OR gate 446D. The second AND gate 446A may perform a logic AND operation on the inverted trimming period signal TRIMB and the preliminary code DOUT_ PRE<0:5>, and output the detection code DOUT<0:3>. The third AND gate 446B may perform a logic AND operation on the trimming period signal TRIM and the preliminary code DOUT_PRE<0:5>. The fourth AND gate 446C may perform a logic AND operation on the inverted trimming period signal TRIMB and the code stored in the latch 444. The OR gate 446D may perform a logic OR operation on outputs of the third and fourth AND gates 446B and 446C, and output the operation results as the trimming code D_TRIM<0:5>.

When the trimming period signal TRIM is activated, the code output component 440 having the above-described structure may output the preliminary code DOUT_PRE<0: 5> as the trimming code D_TRIM<0:5>, and store the trimming code D_TRIM<0:5> in the latch 444 according to the timing signal T1. On the other hand, when the trimming period signal TRIM is deactivated, the code output component 440 may output the preliminary code DOUT_PRE<0: 5> as the detection code DOUT<0:3>, and output the code stored in the latch 444 as the trimming code D_TRIM<0:5>.

Figure 11:
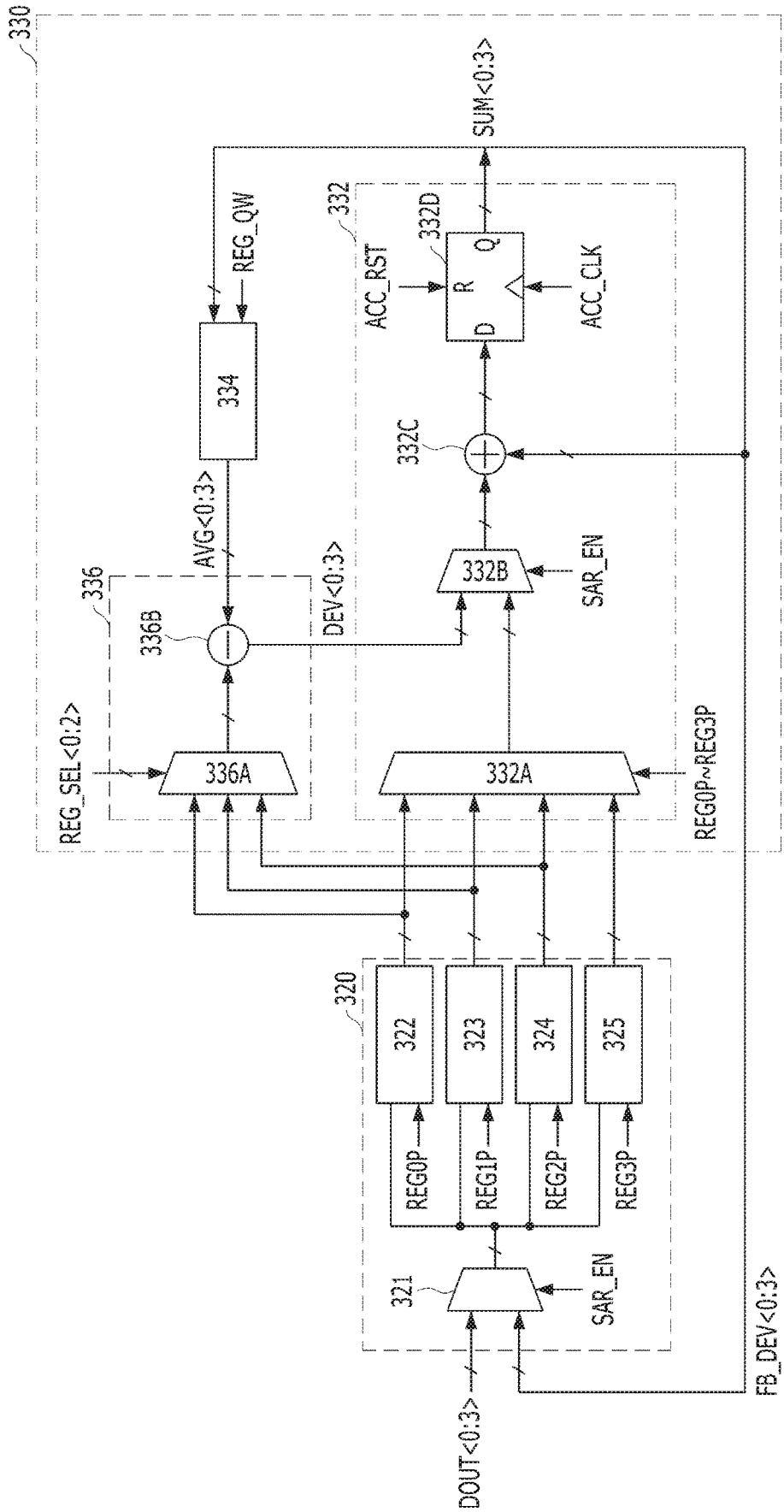
FIG. 11 is a circuit diagram illustrating a storage and an average-deviation calculator shown in FIG. 5.

FIG. 11 is a circuit diagram illustrating the storage 320 and the average-deviation calculator 330 shown in FIG. 5.

Referring to FIG. 11, the storage 320 may include a storage selector 321 and first to fourth registers 322 to 325.

The storage selector 321 may select the detection code DOUT<0:3> provided from the detection 310 when the period signal SAR_EN is activated, and select the combined deviation code FB_DEV<0:3> provided from the average-deviation calculator 330 when the period signal SAR_EN is deactivated. The first to fourth registers 322 to 325 may be sequentially enabled according to the first to fourth register control signals REG0P to REG3P, and store an output of the storage selector 321.

The average-deviation calculator 330 may include a cumulative summing component 332, an average calculating component 334 and a deviation calculating component 336.

When the period signal SAR_EN is activated, the cumulative summing component 332 may cumulatively sum up the first to fourth stored values stored in the first to fourth registers 322 to 325, and output a sum signal SUM<0:3>, according to the first to fourth register control signals REG0P to REG3P and the accumulation clock ACC_CLK. When the period signal SAR_EN is deactivated, the cumulative summing component 332 may cumulatively sum up a deviation code DEV<0:3> provided from the deviation calculating component 336, and output the combined deviation code FB_DEV<0:3>, according to the accumulation clock ACC_CLK and the accumulation reset signal ACC_RST.

More specifically, the cumulative summing component 332 may include a first accumulation selector 332A, a second accumulation selector 332B, an adder 332C and a D flip-flop 332D.

The first accumulation selector 332A may select and output the first to fourth stored values according to the first to fourth register control signals REG0P to REG3P. The second accumulation selector 332B may select and output an output of the first accumulation selector 332A or the deviation code DEV<0:3> outputted from the deviation calculator 336 according to the period signal SAR_EN. The adder 3320 may add an output of the second accumulation selector 332B and an output of the D flip-flop 332D. The D flip-flop 332D may be reset according to the accumulation reset signal ACC_RST, and store an output of the adder 332C according to the accumulation clock ACC_CLK. When the period signal SAR_EN is activated, the cumulative summing component 332 having the above-described structure may sequentially and cumulatively sum up the first to fourth stored values of the first to fourth registers 322 to 325 according to the accumulation clock ACC_CLK, and output the sum signal SUM<0:3>. When the period signal SAR_EN is deactivated, the cumulative summing component 332 may sequentially and cumulatively sum up the deviation code DEV<0:3> according to the accumulation clock ACC_CLK, and output the combined deviation code FB_DEV<0:3>.

The average calculating component 334 may output a value obtained by dividing the sum signal SUM<0:3> by the number of the first to fourth registers 322 to 325, i.e., 4, as an average value, i.e., an average code AVG<0:3>, according to the average calculation signal REG_QW. In various embodiments, the average calculating component 334 may be implemented with a shifter that shifts each bit of the sum signal SUM<0:3> to the right by the number of times (i.e., 2 times) corresponding to the number of the first to fourth registers 322 to 325, i.e., 4, and outputs the shifted signal as the average code AVG<0:3>, according to the average calculation signal REG_QW. The deviation calculating component 336 may calculate the deviation code DEV<0:3> by subtracting the first to third stored values from the average code AVG<0:3>, respectively, according to the selection signal REG_SEL<0:2>.

The deviation calculating component 336 may include a deviation selector 336A and a subtractor 336B. The deviation selector 336A may select and output one of the first to third stored values according to the selection signal REG_SEL<0:2>. The subtractor 336B may output a difference between the average code AVG<0:3> and an output of the deviation selector 336A as the deviation code DEV<0:3>.

When the period signal SAR_EN is activated, the average-deviation calculator 330 having the above-described structure may generate the sum signal SUM<0:3> by sequentially accumulating the first to fourth stored values according to the first to fourth register control signals REG0P to REG3P and the accumulation clock ACC_CLK. When the period signal SAR_EN is deactivated, the average-deviation calculator 330 may calculate the average code AVG<0:3> based on the sum signal SUM<0:3> according to the average calculation signal REG_QW. Further, the average-deviation calculator 330 may calculate the combined deviation code FB_DEV<0:3> corresponding to the deviations between the average code AVG<0:3> and the first to third stored values according to the selection signal REG_SEL<0:2>. Furthermore, the average-deviation calculator 330 may provide the combined deviation code FB_DEV<0: 3> to the storage 320. Although it is described in FIG. 11 that the average-deviation calculator 330 provides the storage 320 with the combined deviation code FB_DEV<0:3> obtained by accumulating the deviation code DEV<0:3>, the present invention is not limited thereto. According to embodiments, the average-deviation calculator 330 may not accumulate the deviation code DEV<0:3> but provide the deviation code DEV<0:3> to the storage 320.

Figure 12:
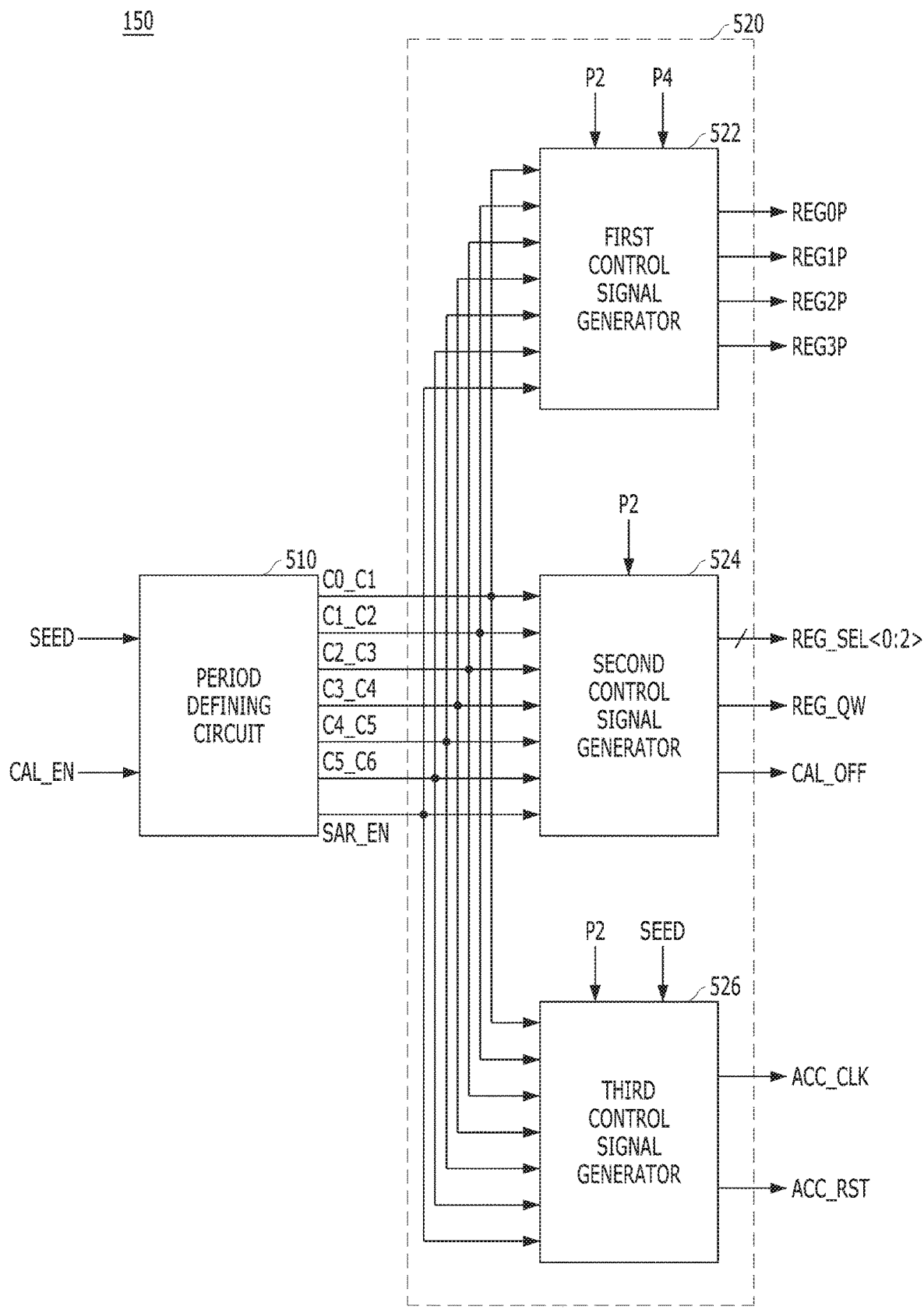
FIG. 12 is a block diagram illustrating a calibration control circuit shown in FIG. 5.

FIG. 12 is a detailed block diagram illustrating the calibration control circuit 150 shown in FIG. 5.

Referring to FIG. 12, the calibration control circuit 150 may include a period defining circuit 510 and a control signal generation circuit 520.

The period defining circuit 510 may generate first to sixth period defining signals C0_C1 to C5_C6 which are activated in the respective cycles of the seed signal SEED, when the training mode signal CAL_EN is activated. For example, the period defining circuit 510 may generate the first period defining signal C0_C1 having an activation period between a first rising edge and a second rising edge of the seed signal SEED. Further, the period defining circuit 510 may generate the second period defining signal C1_C2 having an activation period between the second rising edge and a third rising edge of the seed signal SEED. The first to sixth period defining signals C0_C1 to C5_C6 may be signals activated at logic low levels. In addition, the period defining circuit 510 may be enabled according to the training mode signal CAL_EN, and generate the period signal SAR_EN deactivated according to one of the first to sixth period defining signals CO_C1 to C5_C6. In various embodiments, the period defining circuit 510 may deactivate the period signal SAR_EN according to the fifth period defining signal C4_C5 among the first to sixth period defining signals CO_C1 to C5_C6.

The control signal generation circuit 520 may generate the first to fourth register control signals REG0P to REG3P according to the first to sixth period defining signals CO_C1 to C5_C6 and the period signal SAR_EN.

More specifically, the control signal generation circuit 520 may include first to third control signal generators 522 to 526. The first control signal generator 522 may generate the first to fourth register control signals REG0P to REG3P according to the first to sixth period defining signals CO_C1 to C5_C6, the period signal SAR_EN, the third pulse signal P2 and the fifth pulse signal P4. The second control signal generator 524 may generate the average calculation signal REG_QW, the selection signal REG_SEL<0:2> and the training end signal CAL_OFF according to the first to sixth period defining signals CO_C1 to C5_C6, the period signal SAR_EN and the third pulse signal P2. The third control signal generator 526 may generate the accumulation clock ACC_CLK and the accumulation reset signal ACC_RST according to the first to sixth period defining signals CO_C1 to C5_C6, the period signal SAR_EN, the third pulse signal P2 and the seed signal SEED.

Figure 13:
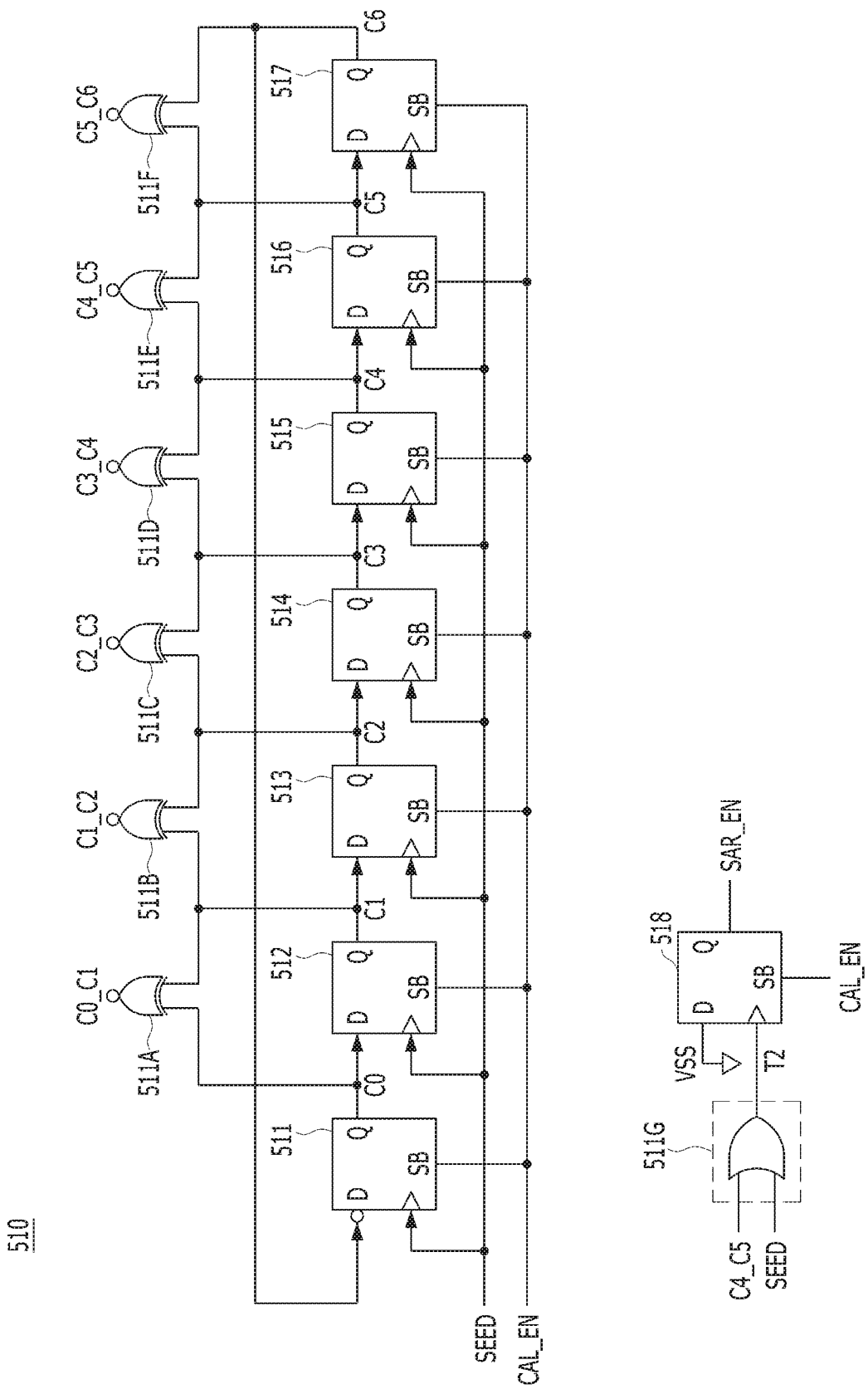
FIG. 13 is a circuit diagram illustrating a period defining circuit shown in FIG. 12.

FIG. 13 is a circuit diagram illustrating the period defining circuit 510 shown in FIG. 12.

Referring to FIG. 13, the period defining circuit 510 may include first to eighth D flip-flops 511 to 518, first to sixth comparators 511A to 511F and a clock combiner 511G.

The first to seventh D flip-flops 511 to 517, which are coupled in series to one another, may receive the training mode signal CAL_EN as a set bar signal SB, receive the seed signal SEED as a clock signal, and output first to seventh preliminary period signals C0 to C6, respectively. The first D flip-flop 511 may receive an inverted signal of an output terminal Q of the seventh D flip-flop 517 through an input terminal D, and output the first preliminary period signal C0 through an output terminal Q. The second to seventh D flip-flops 512 to 517 may receive output signals of respective previous stages through respective input terminals D, and sequentially output the second to seventh preliminary period signals C1 to C6 through respective output terminals Q.

The first to sixth comparators 511A to 511F may output the first to sixth period defining signals CO_C1 to C5_C6 by comparing every two neighboring preliminary period signals of the first to seventh preliminary period signals C0 to C6. The first to sixth comparators 511A to 511F may be implemented with a XNOR gate that outputs the first to sixth period defining signals CO_C1 to C5_C6 by performing a logic XNOR operation on the every two neighboring preliminary period signals. For example, when the first preliminary period signal C0 and the second preliminary period signal C1 have different logic levels, the first comparator 511A may output the first period defining signal CO_C1 having a logic low level.

The clock combiner 511G may generate a period clock T2 by performing a logic OR operation on the fifth period defining signal C4_C5 and the seed signal SEED. In other words, when both of the fifth period defining signal C4_C5 and the seed signal SEED are at logic low levels, the clock combiner 511G may output the period clock T2 having the logic low level.

The eighth D flip-flop 518 may receive the training mode signal CAL_EN as a set bar signal SB, receive the ground voltage VSS through an input terminal D, receive the period clock T2 as a clock signal, and output the period signal SAR_EN.

Figure 14:
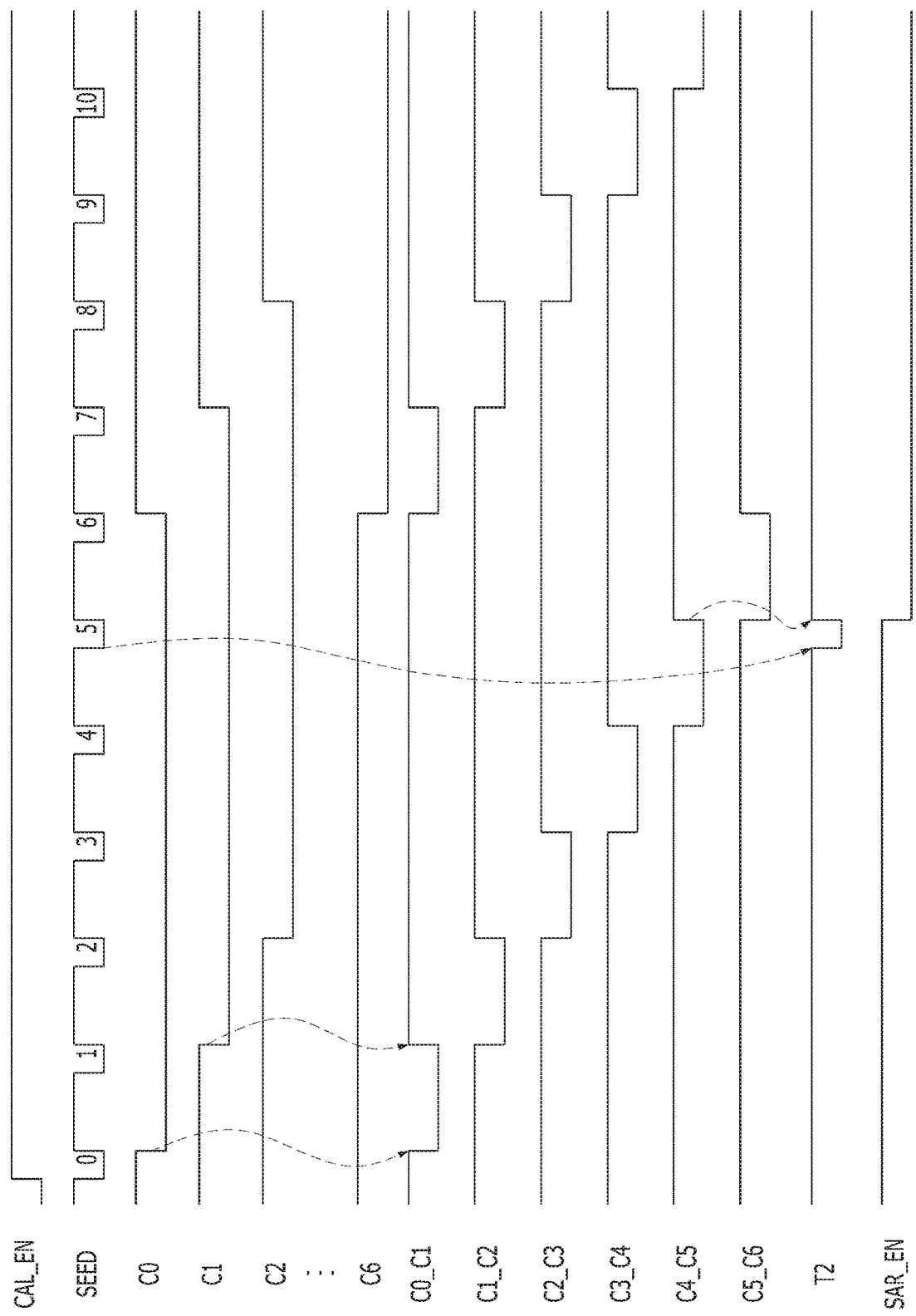
FIG. 14 is a timing diagram illustrating an operation of the period defining circuit shown in FIG. 13.

FIG. 14 is a timing diagram illustrating an operation of the period defining circuit 510 shown in FIG. 13.

Referring to FIG. 14, the first to eighth D flip-flops 511 to 518 may set the first to seventh preliminary period signals C0 to C6 and the period signal SAR_EN to logic high levels during the deactivation period of the training mode signal CAL_EN, that is, before the training operation.

When the training mode signal CAL_EN is activated, the first to seventh D flip-flops 511 to 517 may sequentially output the first to seventh preliminary period signals C0 to C6 at the logic low levels according to the rising edges of the seed signal SEED. The first to sixth comparators 511A to 511F may output the first to sixth period defining signals CO_C1 to C5_C6 at the logic low levels when the every two neighboring preliminary period signals have different logic levels.

The dock combiner 511G may output the period clock T2 having the logic low level when both of the fifth period defining signal C4_C5 and the seed signal SEED are at logic low levels. The eighth D flip-flop 518 may deactivate and output the period signal SAR_EN at the logic low level, in synchronization with a rising edge of the period clock T2.

Figure 15:
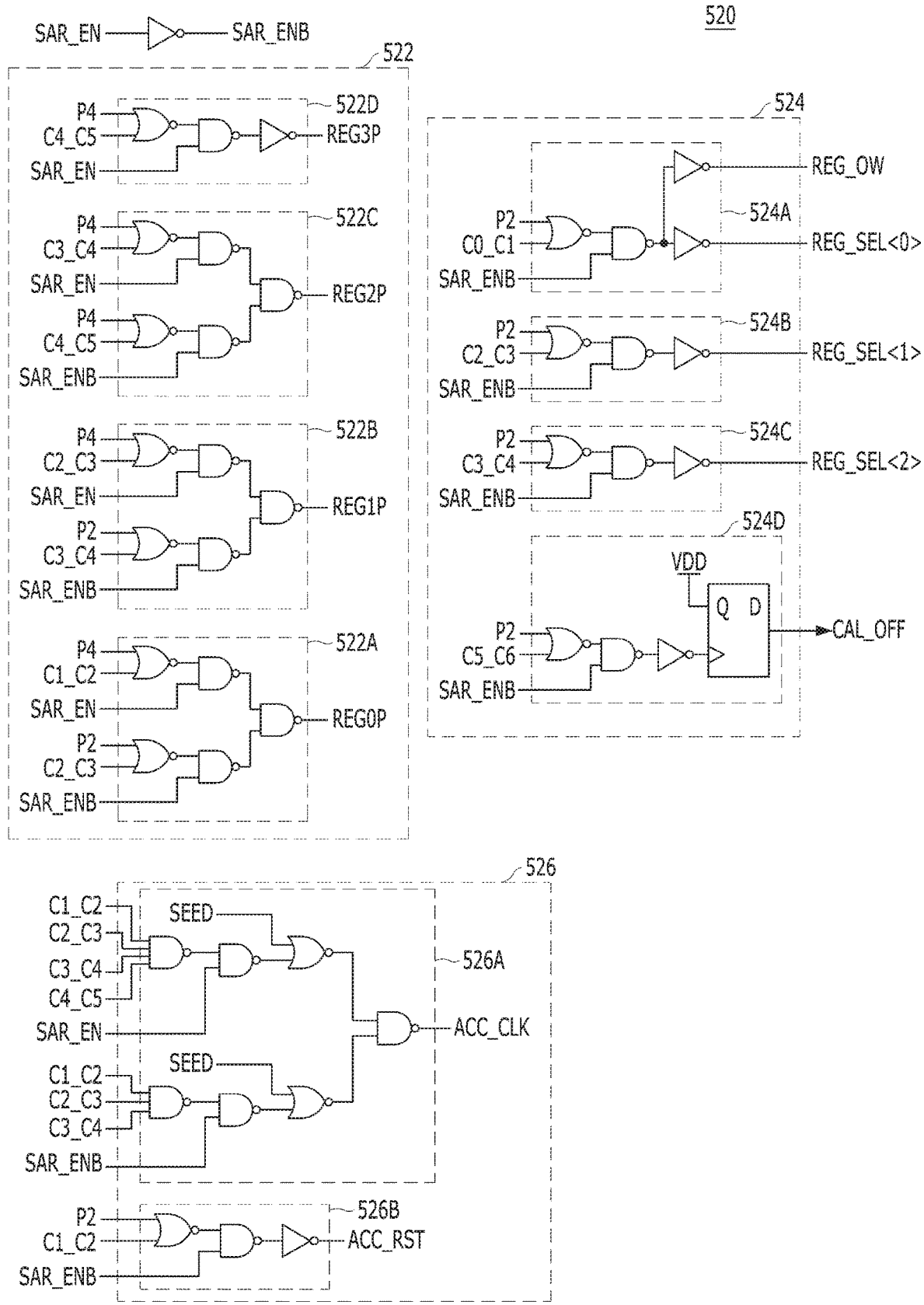
FIG. 15 is a circuit diagram illustrating a control signal generator shown in FIG. 12.

FIG. 15 is a circuit diagram illustrating the control signal generation circuit 520 shown in FIG. 12.

Referring to FIG. 15, the control signal generation circuit 520 may include the first control signal generator 522, the second control signal generator 524 and the third control signal generator 526. The first control signal generator 522 may include first to fourth combiners 522A to 522D.

The first combiner 522A may output the first register control signal REG0P according to the second period defining signal C1_C2 and the fifth pulse signal P4 when the period signal SAR_EN is activated. Further, the first combiner 522A may output the first register control signal REG0P according to the third period defining signal C2_C3 and the third pulse signal P2 when the period signal SAR_EN is deactivated, i.e., the period signal SAR_ENB is activated. The first combiner 522A may output the first register control signal REG0P when both of the second period defining signal C1_C2 and the fifth pulse signal P4 are at logic low levels under the circumstance where the period signal SAR_EN is activated. Further, the first combiner 522A may output the first register control signal REG0P when both of the third period defining signal C2_C3 and the third pulse signal P2 are at logic low levels under the circumstance where the period signal SAR_EN is deactivated. The second combiner 522B may output the second register control signal REG1P according to the third period defining signal C2_C3 and the fifth pulse signal P4 when the period signal SAR_EN is activated. Further, the second combiner 522B may output the second register control signal REG1P according to the fourth period defining signal C3_C4 and the third pulse signal P2 when the period signal SAR_EN is deactivated. The third combiner 522C may output the third register control signal REG2P according to the fourth period defining signal C3_C4 and the fifth pulse signal P4 when the period signal SAR_EN is activated. Further, the third combiner 522C may output the third register control signal REG2P according to the fifth period defining signal C4_C5 and the third pulse signal P2 when the period signal SAR_EN is deactivated. The fourth combiner 522D may output the fourth register control signal REG3P according to the fifth period defining signal C4_C5 and the fifth pulse signal P4 when the period signal SAR_EN is activated.

The second control signal generator 524 may include fifth to eighth combiners 524A to 524D.

The fifth combiner 524A may output the first bit REG_SEL<0> of the selection signal REG_SEL<0:2> according to the first period defining signal C0_C1 and the third pulse signal P2 when the period signal SAR_EN is deactivated. In other words, the fifth combiner 524A may output the first bit REG_SEL<0> when both of the first period defining signal C0_C1 and the third pulse signal P2 are at logic low levels. At this time, the fifth combiner 524A may output the average calculation signal REG_QW having the same logic level as the first bit REG_SEL<0>. The sixth combiner 524B may output the second bit REG_SEL<1> of the selection signal REG_SEL<0:2> according to the third period defining signal C2_C3 and the third pulse signal P2 when the period signal SAR_EN is deactivated. The seventh combiner 524C may output the third bit REG_SEL<2> of the selection signal REG_SEL<0:2> according to the fourth period defining signal C3_C4 and the third pulse signal P2 when the period signal SAR_EN is deactivated. The eighth combiner 524D may generate a clock pulse signal CAL_OFFP according to the sixth period defining signal C5_C6 and the third pulse signal P2, and activate and output the training end signal CAL_OFF at a logic high level according to the clock pulse signal CAL_OFFP, when the period signal SAR_EN is deactivated.

The third control signal generator 526 may include a ninth combiner 526A and a $10^{th}$ combiner 526B.

The ninth combiner 526A may output the accumulation clock ACC_CLK according to the second to fifth period defining signals C1_C2 to C4_C5 and the seed signal SEED when the period signal SAR_EN is activated. Further, the ninth combiner 526A may output the accumulation clock ACC_CLK according to the second to fourth period defining signals C1_C2 to C3_C4 and the seed signal SEED when the period signal SAR_EN is deactivated. In other words, when the period signal SAR_EN is activated, the ninth combiner 526A may output the accumulation clock ACC_CLK in the case that the seed signal SEED becomes a logic low level while any one of the second to fifth period defining signals C1_C2 to C4_C5 is at a logic low level. Furthermore, when the period signal SAR_EN is deactivated, the ninth combiner 526A may output the accumulation clock ACC_CLK in the case that the seed signal SEED becomes a logic low level while any one of the second to fourth period defining signals C1_C2 to C3_C4 is at a logic low level. The $10^{th}$ combiner 526B may output the accumulation reset signal ACC_RST according to the second period defining signal C1_C2 and the third pulse signal P2 when the period signal SAR_EN is deactivated.

The logics of the first to $10^{th}$ combiners 522A to 522D, 524A to 524D, 526A and 526B shown in FIG. 15 are merely examples, and the present invention is not limited thereto. The combiners may be implemented with various logics for controlling timing of the calibration circuit 140 and the calibration control circuit 150.

Operations of the calibration circuit 140 and the calibration control circuit 150 are described below with reference to FIGS. 5 to 16B.

Figure 16A:

FIGS. 16A and 16B are timing diagrams illustrating the operations of the calibration circuit 140 and the calibration control circuit 150 shown in FIG. 5. Although not illustrated in FIGS. 16A and 16B, the first to sixth period defining signals C0_C1 to C5_C6 may have sequential activation periods between respective neighboring rising edges of the seed signal SEED, as illustrated in FIG. 14. For example, the first period defining signal C0_C1 may be activated at a logic low level for a period between the first rising edge and the second rising edge of the seed signal SEED and a period between a seventh rising edge and an eighth rising edge of the seed signal SEED.

Referring to FIG. 16A, the seed signal SEED and the first to seventh pulse signals P0 to P6 are sequentially activated according to the inverted falling signal QDQSB. The comparison signal COMP is outputted by comparing the phases of the rising signal IDQS and the falling signal QDQS. The comparison signal COMP is converted and outputted in the reverse order of the preliminary code DOUT_PRE<0:5> according to the seed signal SEED and the first to seventh pulse signals P0 to P6. That is, the comparison signal COMP is outputted as the converted preliminary code DOUT_PRE<5:0>. At this time, according to the trimming period signal TRIM having a logic high level, the preliminary code DOUT_PRE<0:5> is outputted as the trimming code D_TRIM<0:5> to set the delay amount of the first trimmer 312. Whenever the rising signal IDQS and the falling signal QDQS are inputted, the above-described operation is repeated so that the trimming code D_TRIM<0:5> may be outputted. The above-described operation may be defined as the initial trimming setting operation which is performed for the initial period of the activation period of the first pattern data BL0_CALP, that is, one cycle of the seed signal SEED, which is described in FIG. 4.

Subsequently, the trimming period signal TRIM is deactivated at a logic low level according to the activation of the seventh pulse signal P6.

During the latter period of the activation period of the first pattern data BL0_CALP, that is, the next period of the seed signal SEED, the preliminary code DOUT_PRE<0:5> corresponding to the phase difference between the rising signal IDQS and the falling signal QDQS is outputted as the detection code DOUT<0:3> to adjust the delay amount of the second trimmer 314, according to the trimming period signal TRIM having the logic low level. When the first register control signal REG0P is activated, the detection code DOUT<0:3> is finally stored in the first register 322, and the first stored value stored in the first register 322 is outputted as the sum signal SUM<0:3> according to the accumulation clock ACC_CLK.

During the activation period of the second pattern data BL1_CALP, that is, the next period of the seed signal SEED, the preliminary code DOUT_PRE<0:5> corresponding to the phase reference between the rising signal IDQS and the falling signal QDQS is outputted as the detection code DOUT<0:3> to adjust the delay amount of the second trimmer 314. The detection code DOUT<0:3> may be finally stored in the second register 323 according to the second register control signal REG1P, and the existing sum signal SUM<0:3>, that is, the first stored value, and the second stored value stored in the second register 323 may be cumulatively summed up and outputted as the sum signal SUM<0:3> according to the accumulation clock ACC_CLK. Similarly, during the activation period of the third pattern data BL2_CALP, that is, the next period of the seed signal SEED, the existing sum signal SUM<0:3>, that is, the sum of the first and second stored values, and the third stored value stored in the third register 324 may be summed up and outputted as the sum signal SUM<0:3> according to the third register control signal REG2P and the accumulation clock ACC_CLK. Finally, during the initial period of the activation period of the fourth pattern data BL3_CALP, that is, the next period of the seed signal SEED, the first to fourth stored values may be summed up and outputted as the sum signal SUM<0:3>.

As described above, the operation of storing the detection code DOUT<0:3> corresponding to the phase difference between the rising signal IDQS and the falling signal QDQS in the respective registers during the latter period of the activation period of the first pattern data BL0_CALP, the activation periods of the second and third pattern data BL1_CALP and BL2_CALP and the initial period of the activation period of the fourth pattern data BL3_CALP may be defined as the phase detection operation.

Subsequently, the period signal SAR_EN is deactivated to a logic low level. Accordingly, the average-deviation calculating operation of the average-deviation calculator 330 may be performed.

Referring to FIG. 16B, the average calculation signal REG_QW and the first bit REG_SEL<0> of the selection signal REG_SEL<0:2> are activated. The average code AVG<0:3> may be calculated based on the sum signal SUM<0:3> according to the average calculation signal REG_QW, and the deviation code DEV<0:3> obtained by subtracting the first stored value from the average code AVG<0:3> may be calculated according to the first bit REG_SEL<0>.

The accumulation reset signal ACC_RST may be activated to reset the sum signal SUM<0:3>. The deviation code DEV<0:3> is outputted as the sum signal SUM<0:3> according to the accumulation clock ACC_CLK. At this time, the sum signal SUM<0:3> may be provided as the combined deviation code FB_DEV<0:3>. According to the third pulse signal P2, the first register control signal REG0P is activated to re-store the combined deviation code FB_DEV<0:3> in the first register 322. At the same time, the second bit REG_SEL<1> of the selection signal REG_SEL<0:2> may be activated, and the deviation code DEV<0:3> obtained by subtracting the second stored value from the average code AVG<0:3> may be calculated. According to the accumulation clock ACC_CLK, the deviation code DEV<0:3> and the existing sum signal SUM<0:3> are summed up and outputted as the combined deviation code FB_DEV<0:3>. When the second register control signal REG1P is activated, the combined deviation code FB_DEV<0:3> may be re-stored in the second register 323. Similarly, when the third bit REG_SEL<2> of the selection signal REG_SEL<0:2> and the accumulation clock ACC_CLK are sequentially activated, the deviation code DEV<0:3> and the existing sum signal SUM<0:3> are summed up and outputted as the combined deviation code FB_DEV<0:3>, and the FB_DEV<0:3> may be re-stored in the third register 324 according to the third register control signal REG2P.

The combined deviation code FB_DEV<0:3> may be stored in each of the first to third registers 322 to 324 according to the above-described average-deviation calculating operation. The combined deviation code FB_DEV<0:3> stored in the first to third registers 322 to 324 may be outputted as the first to third calibration codes R1_F1<0:3>, F1_R2<0:3> and R2_F2<0:3>, respectively, which may be used for adjusting the duty ratios of the first to fourth output clocks R1DOCLK, F1DOCLK, R2DOCLK and F2DOCLK.

Figure 17:
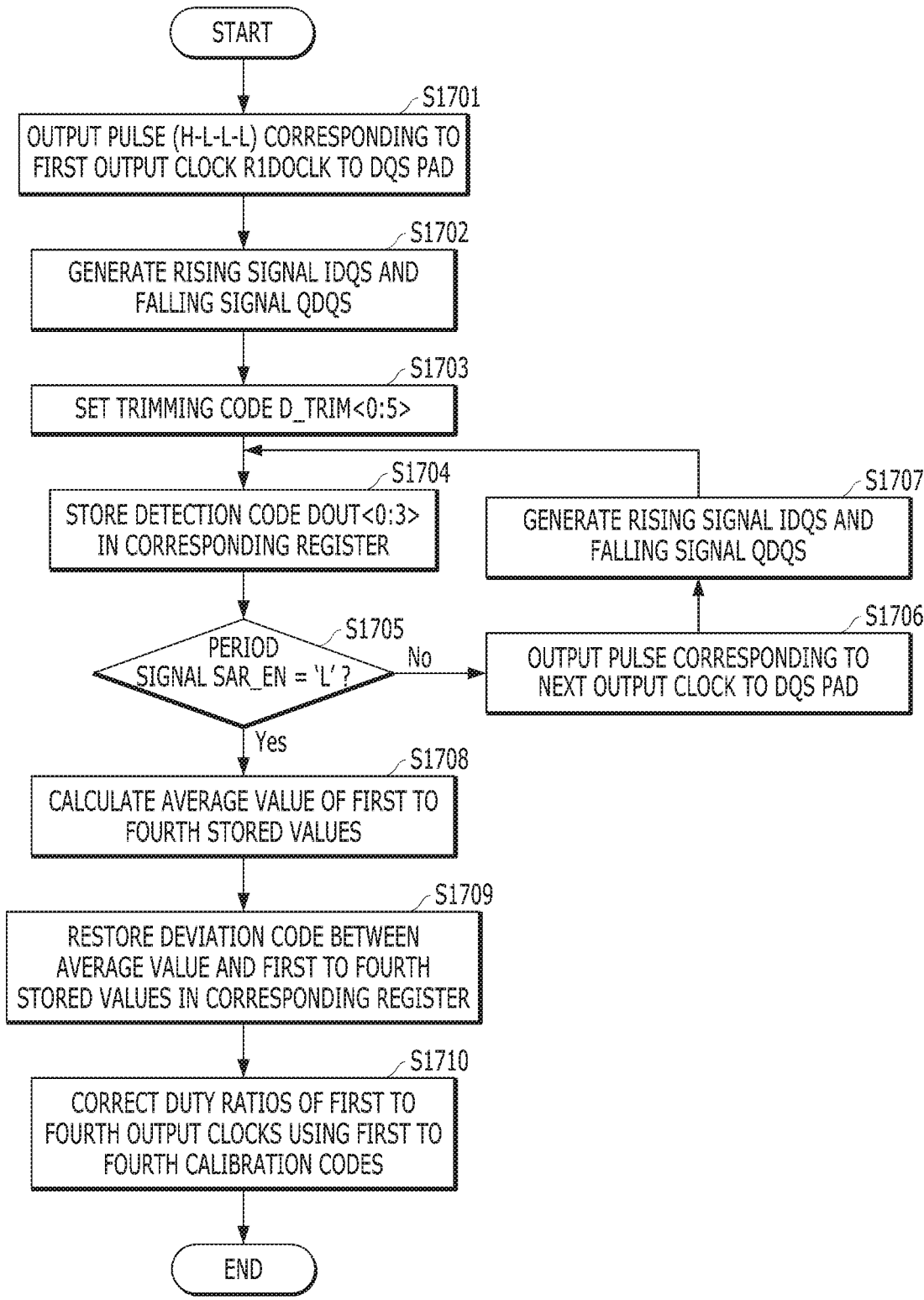
FIG. 17 is a flowchart illustrating a training operation of a semiconductor device in accordance with an embodiment of the present invention.
Figure 18:
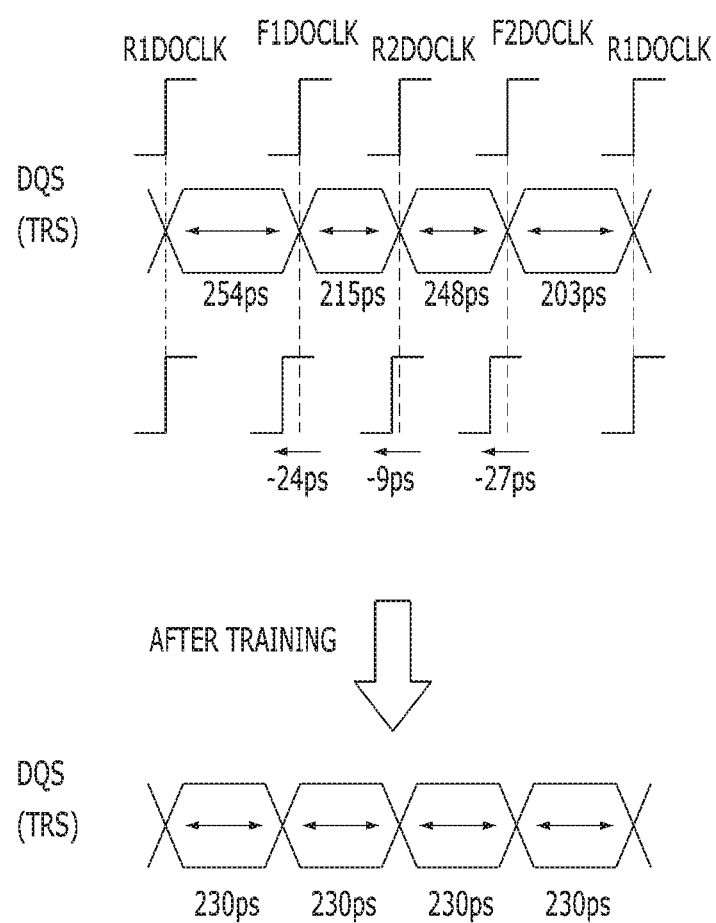
FIG. 18 is a diagram illustrating an operation of duty ratios of output docks according to the training operation shown in FIG. 17.

FIG. 17 is a flowchart illustrating the training operation of the semiconductor device in accordance with an embodiment of the present invention. FIG. 18 is a diagram illustrating an operation of adjusting duty ratios of the output clocks according to the training operation shown in FIG. 17.

Referring to FIG. 17, the transmission circuit 120 outputs the training signal TRS as pulses of H-L-L-L corresponding to the first output clock R1DOCLK to the data strobe pad DQS_P for an activation period of the first pattern data BL0_CALP in the training mode, in step S1701. The receiving circuit 130 generates the rising signal IDQS and the falling signal QDQS which are activated respectively at the rising edge and the falling edge of the training signal TRS inputted to the data strobe pad DQS_P, in step S1702.

As described with reference to FIG. 16A, during the initial period of the activation period of the first pattern data BL0_CALP, the calibration circuit 140 performs the initial trimming setting operation of setting the delay amount of the first trimmer 312 using the trimming code D_TRIM<0:5> corresponding to the phase difference between the rising signal IDQS and the falling signal QDQS, in step S1703.

Subsequently, during the latter period of the activation period of the first pattern data BL0_CALP, the calibration circuit 140 performs the phase detection operation of storing the detection code DOUT<0:3> corresponding to the phase difference between the rising signal IDQS and the falling signal QDQS in the first register 322.

Subsequently, during the activation period of the second pattern data BL1_CALP, the training signal TRS is outputted as pulses of L-H-L-L corresponding to the second output clock F1DOCLK to the data strobe pad DQS_P, in step S1706. The receiving circuit 130 generates the rising signal IDQS and the falling signal QDQS which are activated respectively at the rising edge and the falling edge of the training signal TRS, in step S1707. The calibration circuit 140 performs the phase detection operation of storing the detection code DOUT<0:3> corresponding to the phase difference between the rising signal IDQS and the falling signal QDQS in the second register 323, in step S1704.

Similarly, during the activation period of the third pattern data BL2_CALP, the training signal TRS is outputted as pulses of L-L-H-L corresponding to the third output clock R2DOCLK to the data strobe pad DQS_P, in step S1706. The receiving circuit 130 generates the rising signal IDQS and the falling signal QDQS which are activated respectively at the rising edge and the falling edge of the training signal TRS, in step S1707. The calibration circuit 140 performs the phase detection operation of storing the detection code DOUT<0:3> corresponding to the phase difference between the rising signal IDQS and the falling signal QDQS in the third register 324, in step S1704.

Lastly, during the activation period of the fourth pattern data BL3_CALP, the training signal TRS is outputted as pulses of L-L-L-H corresponding to the fourth output clock F2DOCLK to the data strobe pad DQS_P, in step S1706. The receiving circuit 130 generates the rising signal IDQS and the falling signal QDQS which are activated respectively at the rising edge and the falling edge of the training signal TRS, in step S1707. The calibration circuit 140 performs the phase detection operation of storing the detection code DOUT<0:3> corresponding to the phase difference between the rising signal IDQS and the falling signal QDQS in the fourth register 325, in step S1704. During the phase detection operation, the first to fourth stored values stored in the first to fourth registers 322 to 325 are summed up, and finally outputted as the sum signal SUM<0:3>.

Subsequently, when the period signal SAR_N is deactivated to a logic low level in step S1705, the average-deviation calculating operation may be performed. The calibration circuit 140 calculates the average code AVG<0:

3> based on the sum signal SUM<0:3>, in step S1708. The calibration circuit 140 may re-store the deviation code DEV<0:3>, which is obtained by subtracting the first stored value from the average code AVG<0:3>, in the first register 322, in step S1709. Further, the calibration circuit 140 may re-store in the second register 323 the new combined deviation code FB_DEV<0:3>, which is obtained by adding the deviation code DEV<0:3> obtained by subtracting the second stored value from the average code AVG<0:3> to the previous combined deviation code, in step S1709. Furthermore, the calibration circuit 140 may re-store in the third register 324 the new combined deviation code FB_DEV<0:3>, which is obtained by adding the deviation code DEV<0:3> obtained by subtracting the third stored value from the average code AVG<0:3> to the previous combined deviation code, in step S1709. The first to third stored values re-stored in the respective registers may be outputted as the first to third calibration codes R1_F1<0:3>, F1_R2<0:3> and R2_F2<0:3>, respectively. Subsequently, the dock generation circuit 110 may adjust the duty ratios of the first to fourth output clocks R1DOCLK, F1DOCLK, R2DOCLK and F2DOCLK according to the first to third calibration codes R1_F1<0:3>, F1_R2<0:3> and R2_F2<0:3>, in step S1710.

Referring to FIG. 18, it is assumed that the strobe signal DQS is outputted with a 1-bit pulse width as 254 ps–215 ps–248 ps–203 ps because the duty ratios of the first to fourth output clocks R1DOCLK, F1DOCLK, R2DOCLK and F2DOCLK have been distorted before the training operation. Since the strobe signal DQS is generated according to the four output clocks, the 4-bit pulse width may be constant. In other words, the 4-bit pulse width may be fixed to 920 ps (=254+215+248+203 ps), and the ideal 1-bit pulse width may be 230 ps. Even though an offset (err) may occur when the strobe signal DQS passes through an input/output path, the 1-bit pulse width of the strobe signal DQS passing through the same path may be {254+err} ps–{215+err} ps–{248+err} ps–{203+err} ps.

In the present embodiment, the calibration circuit 140 may calculate the average code AVG<0:3> of {230+err} based on the sum signal SUM<0:3> of {950+4*err}. The calibration circuit 140 may re-store the combined deviation code FB_DEV<0:3> of −24 ps obtained by subtracting the first stored value of {254+err} from the average code AVG<0:3> in the first register 322. Further, the calibration circuit 140 may re-store the combined deviation code FB_DEV<0:3> of −9 ps, which is obtained by adding the deviation code DEV<0:3> of 15 ps obtained by subtracting the second stored value of 215+err from the average code AVG<0:3> to the previous combined deviation code of −24 ps, in the second register 323. Furthermore, the calibration circuit 140 may re-store the combined deviation code FB_DEV<0:3> of −27 ps, which is obtained by adding the deviation code DEV<0:3> of −18 ps obtained by subtracting the third stored value of {248+err} from the average code AVG<0:3> to the previous combined deviation code of −9 ps, in the third register 324.

The re-stored first to third stored values of −24 ps, −9 ps and −27 ps may be outputted as the first to third calibration codes R1_F1<0:3>, F1_R2<0:3> and R2_F2<0:3>, respectively. Therefore, the duty ratios of the first to fourth output clocks R1DOCLK, F1DOCLK, R2DOCLK and F2DOCLK may be adjusted.

As described above, the semiconductor device according to the present embodiment may constantly maintain the 1-bit pulse width of the strobe signal, thereby improving the reliability of the data output operation.

In accordance with embodiments, the semiconductor device may maintain the 1-bit pulse width of the strobe signal, which is finally outputted through the data strobe pad, at a constant level.

Also, in accordance with embodiments, the semiconductor device provides the strobe signal having an accurate duty ratio, thereby improving the reliability of the data output operation.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims.

Also, dispositions and types of the logic gates and transistors described in the aforementioned embodiments may be implemented differently based on the polarity of the inputted signal.

What is claimed is:

1. A semiconductor device comprising:
   a transmission circuit coupled to a data strobe pad, configured to sequentially output pulses corresponding to first to $N^{th}$ output clocks to the data strobe pad in a training mode;
   a receiving circuit coupled to the data strobe pad, configured to receive the pulses from the data strobe pad, and generate a rising signal and a falling signal, which are activated respectively at a rising edge and a falling edge of each of the pulses;
   a calibration circuit configured to sequentially store a detection code corresponding to a phase difference between the rising signal and the falling signal in first to $N^{th}$ registers to calculate an average value of first to $N^{th}$ stored values, according to a period signal, and restore respective deviations between the average value and each of the first to $N^{th}$ stored values in the first to $N^{th}$ registers; and
   a clock generation circuit configured to adjust duty ratios of the first to $N^{th}$ output clocks, using re-stored values of the first to $N^{th}$ registers.

2. The semiconductor device of claim 1, further comprising:
   a calibration control circuit configured to generate the period signal and sequentially activate first to $N^{th}$ register control signals, according to a seed signal which is activated in a set cycle based on at least one of the rising signal and the falling signal, in the training mode.

3. The semiconductor device of claim 2,
   wherein, when the period signal is activated, the calibration circuit sequentially stores the detection code in the first to $N^{th}$ registers according to the first to $N^{th}$ register control signals and sums up the first to $N^{th}$ stored values to generate a sum signal, and
   wherein, when the period signal is deactivated, the calibration circuit calculates the average value based on the sum signal and re-stores the deviations in the first to $N^{th}$ registers.

4. The semiconductor device of claim 2, wherein the calibration control circuit includes:
   a period defining circuit configured to generate a plurality of period defining signals activated in each cycle of the seed signal, and the period signal which is activated according to a training mode signal and deactivated according to one of the period defining signals; and a control signal generation circuit configured to generate the first to $N^{th}$ register control signals according to the period signal and the period defining signals.

5. The semiconductor device of claim 1, wherein the calibration circuit includes:

a detection circuit configured to generate the detection code by detecting the phase difference between the rising signal and the falling signal;

a storage configured to sequentially store the detection code in the first to $N^{th}$ registers according to the first to $N^{th}$ register control signals when the period signal is activated, and sequentially store the deviations in the first to $N^{th}$ registers according to the first to $N^{th}$ register control signals when the period signal is deactivated; and an average-deviation calculator configured to generate a sum signal by summing up the first to $N^{th}$ stored values according to the first to $N^{th}$ register control signals when the period signal is activated, calculate the average value based on the sum signal, and calculate the deviations when the period signal is deactivated.

6. The semiconductor device of claim 5, wherein the detection circuit includes:

a first trimmer having a delay amount that is set according to a trimming code, and configured to delay the rising signal;

a second trimmer having a delay amount that is adjusted according to the detection code, and configured to output a delayed rising signal obtained by delaying an output of the first trimmer;

a comparator configured to output a comparison signal by comparing a phase difference between the delayed rising signal and the falling signal; and a trimming controller configured to generate a seed signal activated in a set cycle according to the falling signal, and generate the trimming code and the detection code which correspond to the comparison signal according to the seed signal.

7. The semiconductor device of claim 6, wherein the trimming controller includes:

a cycle generator configured to generate the seed signal and a plurality of pulse signals which are sequentially activated according to the falling signal;

a code converter configured to convert the comparison signal into a preliminary code according to the seed signal and the pulse signals;

an initial period set component configured to generate a trimming period signal according to one of the pulse signals; and a code output component configured to output the preliminary code as the trimming code or the detection code according to the trimming period signal.

8. The semiconductor device of claim 5, wherein the storage includes:

a storage selector configured to select and output the detection code when the period signal is activated, and select and output the deviations when the period signal is deactivated; and the first to $N^{th}$ registers sequentially enabled according to the first to $N^{th}$ register control signals, and configured to store an output of the storage selector.

9. The semiconductor device of claim 5, wherein the average-deviation calculator includes:

a summing component configured to output the sum signal by summing up the first to $N^{th}$ stored values according to the first to $N^{th}$ register control signals when the period signal is activated;

an average calculating component configured to calculate the average value based on the sum signal when the period signal is deactivated; and a deviation calculating component configured to calculate the deviations by respectively subtracting the first to $N^{th}$ stored values from the average value.

10. The semiconductor device of claim 1, wherein the transmission circuit includes:

a pattern generator enabled according to a training mode signal, and configured to generate first to $N^{th}$ pattern data which are sequentially activated in non-overlapping activation periods, using a first test signal and a second test signal;

a serializer configured to latch the first to $N^{th}$ pattern data according to the first to $N^{th}$ output clocks, respectively, and generate a pull-up control signal and a pull-down control signal by serializing the latched data; and an output driver configured to drive the data strobe pad according to the pull-up control signal and the pull-down control signal.

11. The semiconductor device of claim 10, wherein the pattern generator includes:

a frequency divider configured to generate a first divided clock and a second divided clock by dividing the first and second test signals according to the training mode signal;

a first signal generator configured to generate a plurality of shift signals which are sequentially activated according to the first divided clock;

a second signal generator configured to receive the last shift signal among the plurality of shift signals from the first signal generator, and generate a plurality of shift signals which are sequentially activated according to the second divided clock; and a pattern combiner configured to output the first to $N^{th}$ pattern data by combining two or more of the shift signals.

12. The semiconductor device of claim 11, wherein the pattern combiner combines one of the shift signals generated from the first signal generator with one of the shift signals generated from the second signal generator, and outputs the combined signal as one of the first to $N^{th}$ pattern data.

13. The semiconductor device of claim 1, wherein the receiving circuit includes:

an input buffer configured to output an internal strobe signal by buffering the pulses according to a training mode signal; and a frequency divider configured to divide the internal strobe signal, and generate the rising signal and the falling signal which are activated at a rising edge and a falling edge of the divided signal, respectively.

14. A method of operating a semiconductor device comprising:

sequentially outputting pulses corresponding to first to $N^{th}$ output clocks to a data strobe pad in a training mode;

receiving the pulses from the data strobe pad, and generating a rising signal and a falling signal which are activated respectively at a rising edge and a falling edge of each of the pulses;

sequentially storing a detection code corresponding to a phase difference between the rising signal and the falling signal in first to $N^{th}$ registers, and generating a sum signal by summing up first to $N^{th}$ stored values;

calculating an average value of the first to $N^{th}$ stored values based on the sum signal, and restoring deviations between the average value and the first to $N^{th}$ stored values in the first to $N^{th}$ registers; and adjusting duty ratios of the first to $N^{th}$ output clocks, using re-stored values of the first to $N^{th}$ registers.

15. The method of claim 14, wherein the sequentially outputting of the pulses corresponding to the first to $N^{th}$ output clocks to the data strobe pad includes:

generating first to $N^{th}$ pattern data which are sequentially activated in non-overlapping activation periods, in the training mode; and latching the first to $N^{th}$ pattern data according to the first to $N^{th}$ output clocks, and outputting the latched data to the data strobe pad.

16. The method of claim 14,
wherein N is 4, and the pulse corresponding to the first output clock has a pattern of first level (FL)-second level (SL)-SL-SL,
wherein the pulse corresponding to the second output clock has a pattern of SL-FL-SL-SL,
wherein the pulse corresponding to the third output clock has a pattern of SL-SL-FL-SL,
wherein the pulse corresponding to the fourth output clock has a pattern of SL-SL-SL-FL, and
wherein FL is logic high level and SL is logic low level, or FL is logic low level and SL is logic high level.

17. The method of claim 14, further comprising:
primarily delaying the rising signal according to a trimming code;
generating a delayed rising signal by secondarily delaying the primarily delayed signal according to the detection code;
outputting a comparison signal by comparing a phase difference between the delayed rising signal and the falling signal; and
generating a seed signal activated in a set cycle according to the falling signal, and generating the trimming code and the detection code corresponding to the comparison signal according to the seed signal.

18. A calibration circuit comprising:
a detection circuit configured to generate a detection code by detecting a phase difference between a rising signal and a falling signal;
a storage configured to select the detection code or a combined deviation code according to a period signal, and store the selected code in first to $N^{th}$ registers according to first to $N^{th}$ register control signals;
a summing component configured to output a sum signal by summing up first to $N^{th}$ stored values stored in the first to $N^{th}$ registers or output the combined deviation code by summing up a deviation code, according to the first to $N^{th}$ register control signals and the period signal;
an average calculating component configured to calculate an average value based on the sum signal; and
a deviation calculating component configured to select one of the first to $(N-1)^{th}$ stored values according to a selection signal, and output a difference between the average value and the selected stored value as the deviation code.

19. The calibration circuit of claim 18, wherein the cumulative summing component includes:
a first accumulation selector configured to select and output one of the first to $N^{th}$ stored values according to the first to $N^{th}$ register control signals;
a second accumulation selector configured to select and output one of the output of the first accumulation selector and the deviation code according to the period signal;
an adder configured to add up the output of the second accumulation selector and the sum signal or the combined deviation code; and
a flip-flop configured to store an output of the adder according to an accumulation clock.

20. The calibration circuit of claim 18, wherein the deviation calculating component includes:
a deviation selector configured to select one of the first to third stored values according to the selection signal; and
a subtractor configured to output a difference between the average value and an output of the deviation selector as the deviation code.

21. A semiconductor device comprising:
a clock generation circuit configured to generate a plurality of clocks, two of which have a phase difference;
a transmission circuit configured to receive multiple pattern data, serialize the multiple pattern data and transmit, to a data strobe pad, the serialized pattern data as training pulses synchronized with the plurality of clocks;
a receiving circuit configured to receive the training pulses and generate a rising signal and a falling signal corresponding to each of the training pulses; and
a calibration circuit configured to detect a pulse width of each of the training pulses, based on a phase difference between the rising signal and the falling signal, determine an average value and deviation values for pulse widths of the training pulses, each of the deviation values corresponding to a difference value between a respective one of the pulse widths and the average value, and correct duty ratios of the plurality of clocks based on the deviation values.

* * * * *